(12) United States Patent
Akita et al.

(10) Patent No.: US 9,166,772 B2
(45) Date of Patent: *Oct. 20, 2015

(54) DATA RECEPTION APPARATUS OVERSAMPLING RECEIVED BITS AND DATA COMMUNICATION SYSTEM OVERSAMPLING RECEIVED BITS

(71) Applicant: DENSO CORPORATION, Kariya, Aichi-pref. (JP)

(72) Inventors: Hironobu Akita, Okazaki (JP); Nobuaki Matsudaira, Kariya (JP); Hirofumi Yamamoto, Obu (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/537,969

(22) Filed: Nov. 11, 2014

(65) Prior Publication Data

US 2015/0063514 A1    Mar. 5, 2015

Related U.S. Application Data

(63) Continuation of application No. PCT/JP2013/004254, filed on Jul. 10, 2013.

(30) Foreign Application Priority Data

Jul. 12, 2012 (JP) ................................ 2012-156553
Feb. 7, 2013 (JP) ................................ 2013-022226

(51) Int. Cl.
*H04L 7/033* (2006.01)
*H04L 7/00* (2006.01)
(Continued)

(52) U.S. Cl.
CPC .............. *H04L 7/0087* (2013.01); *G11C 27/02* (2013.01); *H04L 7/002* (2013.01); *H04L 7/0331* (2013.01); *H04L 7/0337* (2013.01); *H04L 7/046* (2013.01)

(58) Field of Classification Search
CPC ..... H04L 25/068; H04L 25/069; H04L 25/02; H04L 25/40; H04L 7/002; H04L 7/0087; H04L 7/0331; H04L 7/0337; H04L 7/046; G11C 27/02

See application file for complete search history.

(56) References Cited

U.S. PATENT DOCUMENTS 6,510,181 B1    1/2003 Piret
2002/0019883 A1    2/2002 Stiegler et al.
(Continued)

FOREIGN PATENT DOCUMENTS

JP        04-97633 A      3/1992
JP        08-317007 A    11/1996
(Continued)

OTHER PUBLICATIONS

International Search Report of the International Searching Authority mailed Sep. 3, 2013 for the corresponding International application No. PCT/JP2013/004254 (and English translation).
(Continued)

*Primary Examiner* — Sophia Vlahos
(74) *Attorney, Agent, or Firm* — Posz Law Group, PLC

(57) ABSTRACT

A data reception apparatus obtains an integrated number of bits by integrating the numbers of bits of a bit string, obtains an integrated number of samples by integrating the number of samples obtained by oversampling each bit, obtains an approximated line that indicates correspondence between the integrated number of bits and the integrated number of samples, determines, based on the approximated line, a bit length of a bit string corresponding to a segment in which identical values continue in oversampling data after the integrated number of samples. Even when a receive-side clock source has a degree of clock frequency error against a transmit-side clock source, how many samples one bit of the bit string corresponds to is obtained with an accuracy higher than a period of oversampling (inverse of the number of samples).

19 Claims, 22 Drawing Sheets

(51) Int. Cl.
  *G11C 27/02* (2006.01)
  *H04L 7/04* (2006.01)

(56) References Cited

U.S. PATENT DOCUMENTS

| | | | |
|---|---|---|---|
| 2004/0117691 A1* | 6/2004 | Fang | 714/699 |
| 2005/0135527 A1 | 6/2005 | Masui et al. | |
| 2006/0227916 A1 | 10/2006 | Masui et al. | |
| 2012/0020399 A1 | 1/2012 | Doi | |

FOREIGN PATENT DOCUMENTS

| | | |
|---|---|---|
| JP | 09-191298 A | 7/1997 |
| JP | 2006-109082 A | 4/2006 |

OTHER PUBLICATIONS

Written Opinion of the International Searching Authority mailed Sep. 3, 2013 for the corresponding International application No. PCT/JP2013/004254 (and English translation).
PCI Express Architecture. "PCI Express Jitter and BER Revision 1.0" Feb. 11, 2005.
Serial ATA: "High Speed Serialized AT Attachment" Revision 1.0a. Jan. 7, 2003.
Universal Serial Bus Specification, Revision2.0. Apr. 27, 2000.
Richard C. Walker. "Designing Bang-Bang PLLs for Clock and Data Recovery in Serial Data Transmission Systems".
Jaeha Kim et al. "Multi-Gigabit-Rate Clock and Data Recovery Based on Blind Oversampling". IEEE Communications Magazine. Dec. 2003. pp. 68-74.

* cited by examiner

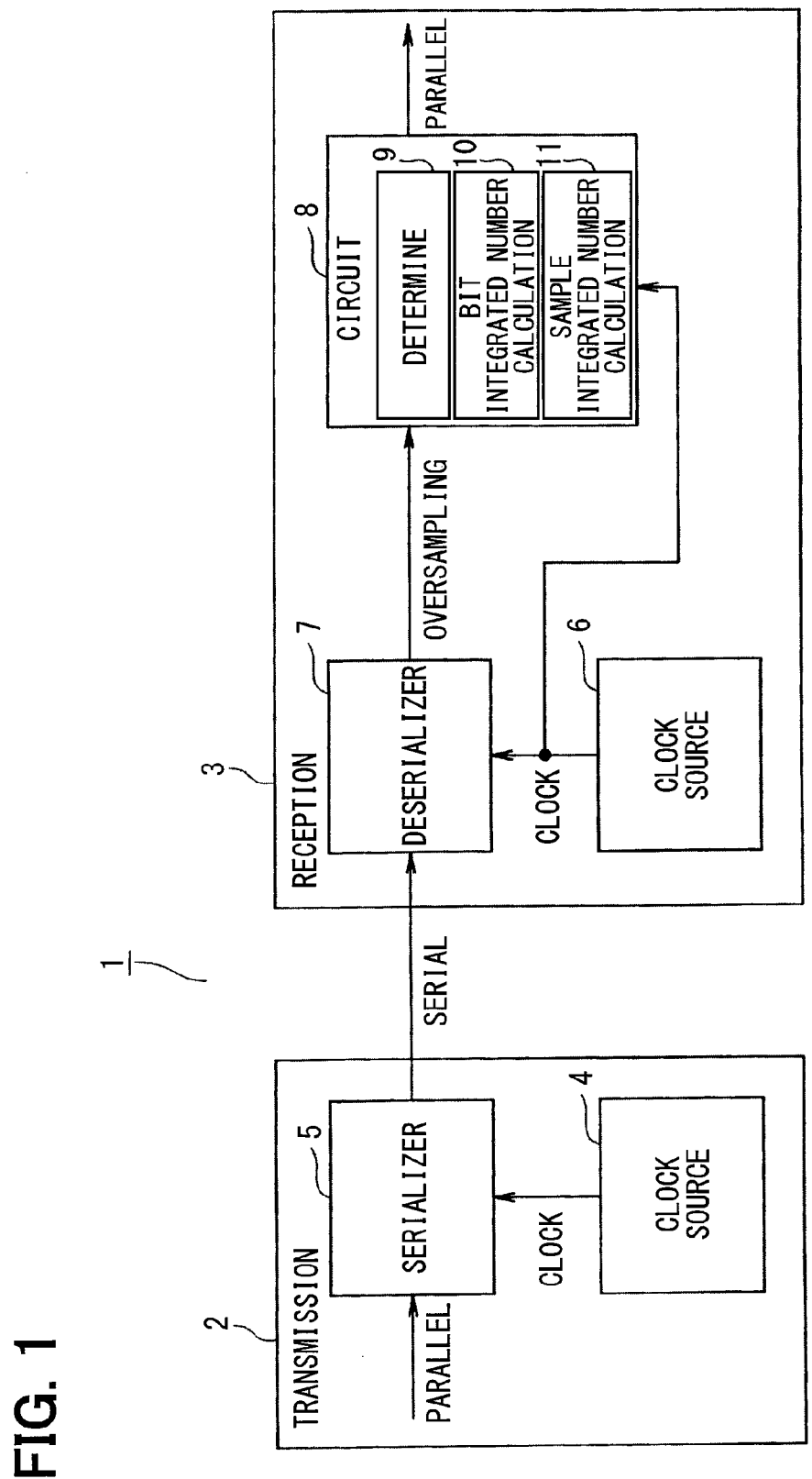

NO FREQUENCY ERROR OCCUR

FREQUENCY ERROR OCCUR

| BIT LENGTH | | 1 | 1 | 1 | 1 | 1 | 1 | 1 |
|---|---|---|---|---|---|---|---|---|
| A | NUMBER OF SAMPLES (NO DEGRADATION FACTOR) | 8 | 8 | 8 | 8 | 8 | 8 | 8 |
| B | NUMBER OF SAMPLES (DEGRADATION FACTOR: FREQUENCY ERROR) | 6 | 6 | 6 | 6 | 6 | 6 | 6 |
| C | NUMBER OF SAMPLES (DEGRADATION FACTOR: PERIODIC JITTER) | 6 | 7 | 8 | 9 | 10 | 9 | 8 |
| D | NUMBER OF SAMPLES (DEGRADATION FACTOR: RANDOM JITTER) | 6 | 8 | 10 | 9 | 8 | 7 | 10 |
| E | NUMBER OF SAMPLES (AVERAGE OF WHOLE OF DEGRADATION FACTORS) | 6 | 7 | 8 | 8 | 8 | 7.333 | 8 |
| F | NUMBER OF SAMPLES (DISCRETIZED DUE TO OVERSAMPLING) | 6 | 7 | 8 | 8 | 8 | 7 | 8 |

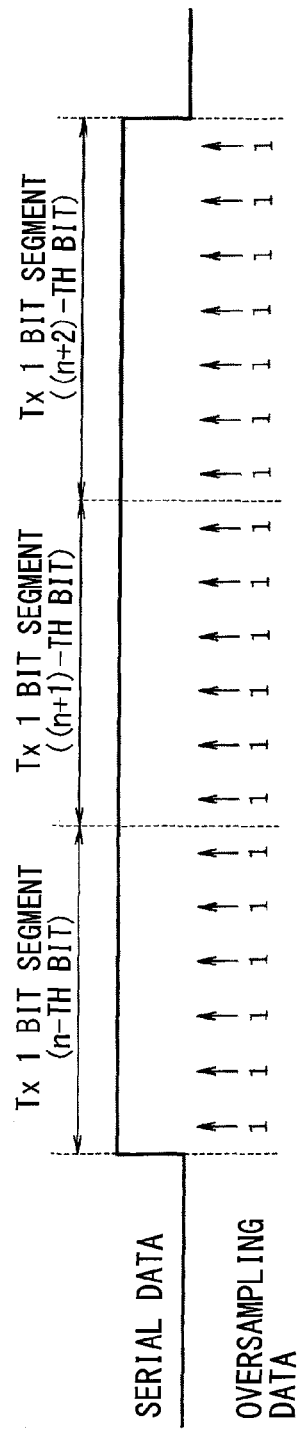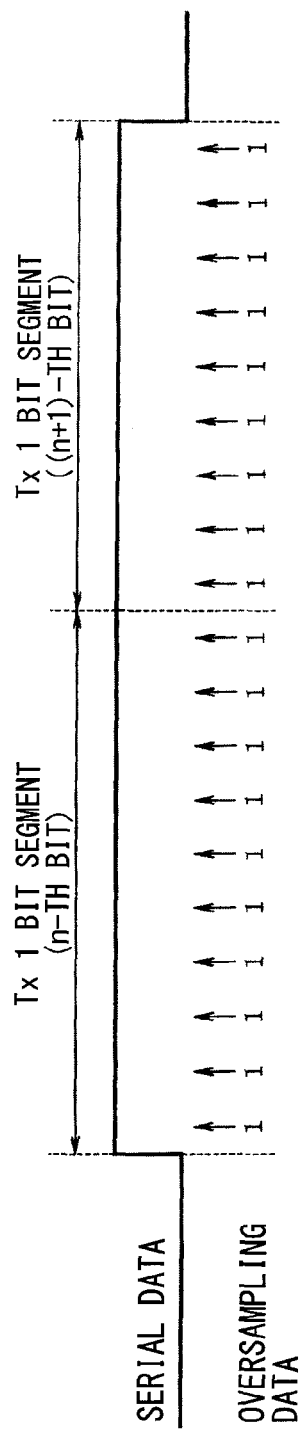

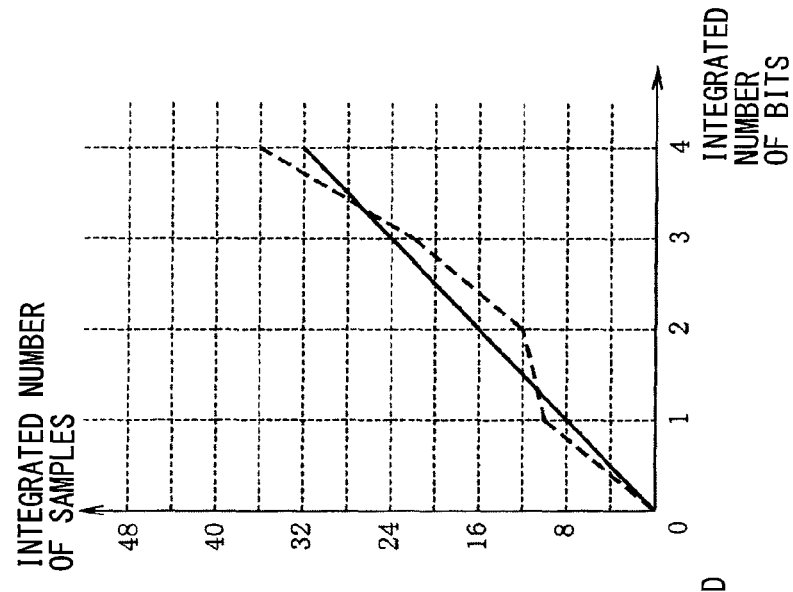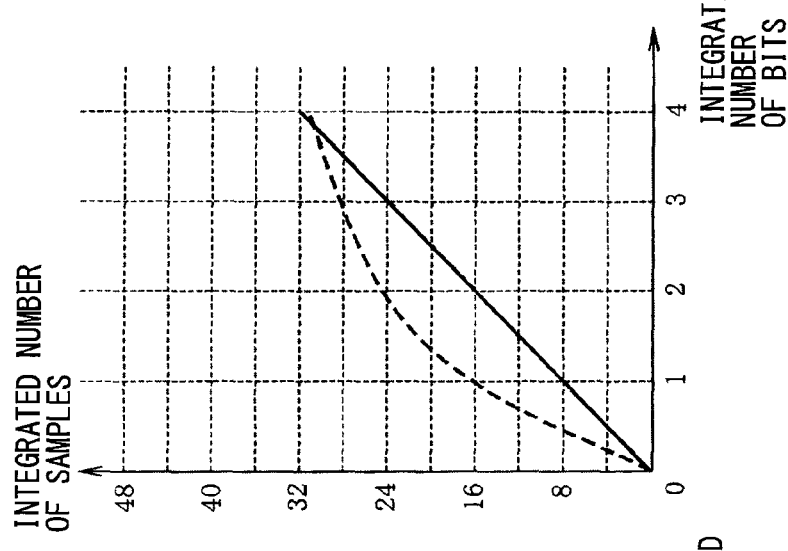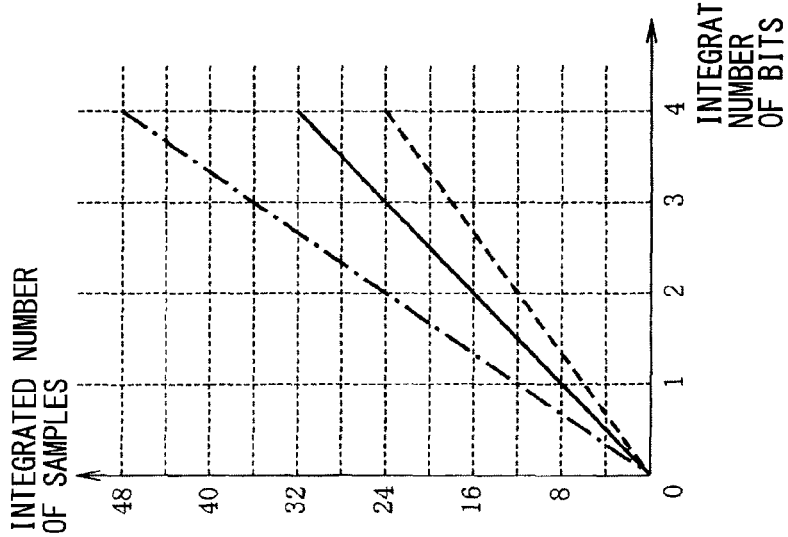

| | NUMBER OF BITS | INTEGRATED NUMBER OF BITS | NUMBER OF SAMPLES | INTEGRATED NUMBER OF SAMPLES |
|---|---|---|---|---|
| PREAMBLE | 1 | 1 | 7 | 7 |
| | 1 | 2 | 9 | 16 |
| | 1 | 3 | 6 | 22 |
| | 1 | 4 | 10 | 32 |
| | 1 | 5 | 7 | 39 |
| DATA | 3 | 8 | 24 | 63 |
| | 1 | 9 | 8 | 71 |
| | 3 | 12 | 24 | 95 |
| | 1 | 13 | 6 | 101 |
| | 2 | 15 | 16 | 117 |
| | ? | ? | 15 | 132 |

$y = 7.857x - 0.2705$

INTEGRATED NUMBER OF SAMPLES vs INTEGRATED NUMBER OF BITS

FIG. 24

| NUMBER OF SAMPLES PER 3 BITS (BASE 10) | CALCULATE RESULT OF NUMBER OF SAMPLES PER 1 BIT | | | | | | | | | | ERROR FROM BASE 10 |
|---|---|---|---|---|---|---|---|---|---|---|---|
| | BASE 10 | INTEGRAL PART OF BASE 2 | | | | | FRACTIONAL PART OF BASE 2 | | | | |
| | | 3 | 2 | 1 | 0 | . | 1 | 2 | 3 | 4 | |
| 22 | 7.333 | 0 | 1 | 1 | 1 | . | 0 | 1 | 0 | 1 | 0.020833 |
| 23 | 7.667 | 0 | 1 | 1 | 1 | . | 1 | 0 | 1 | 1 | -0.02083 |
| 24 | 8.000 | 1 | 0 | 0 | 0 | . | 0 | 0 | 0 | 0 | 0 |
| 25 | 8.333 | 1 | 0 | 0 | 0 | . | 0 | 1 | 0 | 1 | 0.020833 |
| 26 | 8.667 | 1 | 0 | 0 | 0 | . | 1 | 0 | 1 | 1 | -0.02083 |
| 27 | 9.000 | 1 | 0 | 0 | 1 | . | 0 | 0 | 0 | 0 | 0 |
| 28 | 9.333 | 1 | 0 | 0 | 1 | . | 0 | 1 | 0 | 1 | 0.020833 |
| 29 | 9.667 | 1 | 0 | 0 | 1 | . | 1 | 0 | 1 | 1 | -0.02083 |
| 30 | 10.000 | 1 | 0 | 1 | 0 | . | 0 | 0 | 0 | 0 | 0 |
| 31 | 10.333 | 1 | 0 | 1 | 0 | . | 0 | 1 | 0 | 1 | 0.020833 |
| 32 | 10.667 | 1 | 0 | 1 | 0 | . | 1 | 0 | 1 | 1 | -0.02083 |
| 33 | 11.000 | 1 | 0 | 1 | 1 | . | 0 | 0 | 0 | 0 | 0 |
| 34 | 11.333 | 1 | 0 | 1 | 1 | . | 0 | 1 | 0 | 1 | 0.020833 |
| 35 | 11.667 | 1 | 0 | 1 | 1 | . | 1 | 0 | 1 | 1 | -0.02083 |
| 36 | 12.000 | 1 | 1 | 0 | 0 | . | 0 | 0 | 0 | 0 | 0 |
| 37 | 12.333 | 1 | 1 | 0 | 0 | . | 0 | 1 | 0 | 1 | 0.020833 |
| 38 | 12.667 | 1 | 1 | 0 | 0 | . | 1 | 0 | 1 | 1 | -0.02083 |

DATA RECEPTION APPARATUS OVERSAMPLING RECEIVED BITS AND DATA COMMUNICATION SYSTEM OVERSAMPLING RECEIVED BITS

CROSS REFERENCE TO RELATED APPLICATION

The present application is a continuation of PCT/JP2013/004254 filed on Jul. 10, 2013, which is based on Japanese Patent Application No. 2012-156553 filed on Jul. 12, 2012, and Japanese Patent Application No. 2013-22226 filed on Feb. 7, 2013, the disclosures of which are incorporated herein by reference.

TECHNICAL FIELD

The present disclosure relates a data reception apparatus that oversamples data received from a data transmission apparatus and determines the data, and a data communication system that includes the data transmission apparatus and the data reception apparatus.

BACKGROUND ART

A technology of clock data recovery (CDR) in data communications is required to provide a short lock time when the data are intermittently transmitted (when starts and stops of transmission are repeated). For example, PCI Express adopts CDR with phase interpolator, in order to realize a short lock time (refer to Nonpatent Literature 1). In the CDR with phase interpolator, a receiver generates a plurality of clocks having different phases and selects one of the clocks that has a phase closest to that of the received data. This CDR with phase interpolator has a function to select a clock but no function to adjust a clock frequency. This requires a clock frequency error (offset) to be small between a clock source of a data transmission side and a clock source of a data reception side. For instance, Nonpatent Literature 1 uses an identical clock source in both the data transmission side and the data reception side so as not to produce a clock frequency error.

Moreover, Serial ATA requires a clock source in a data transmission side to have a clock frequency error of ±350 [ppm] whereas requiring a clock source in a data reception side to have a clock frequency error similar to that of the data transmission side. Thereby, the clock frequency error can be small between the clock sources in the data transmission side and the data reception side, so that a short lock time is achieved (refer to Nonpatent Literature 2).

Furthermore, USB specifies that a synchronous pattern having a small bit length is used to lock on the premise that the clock frequency error is small enough in between the clock sources of the data transmission side and the data reception side. To be specific, the clock frequency error needs to be 0.25%, i.e., 0.0025=(0.21 [nsec]/(1/12 [Mbps]) (refer to Nonpantent Literature 3).

Further, the transmission of video signals uses data communications that transmit data continuously. In such communications, data can be transmitted continuously once the lock is fulfilled. Thus, even if a lock time is long, CDR with phase synchronization is adopted (refer to Nonpatent Literature 4). The characteristic of CDR with phase synchronization is like that in Nonpatent Literature 4. Suppose that the phase comparison needs 500 cycles, for instance. The phase comparison requires the change points of bits while the presence probability of the change points of bits is about 50%. The lock thus needs about 1000 bits. In particular, the clock frequency error as well as the phase error arises at the time when the power is turned on. The lock further needs additional bits so that the necessary number of bits becomes 10,000 bits, for instance. This requires the lock time in CDR with phase synchronization to be shorter as much as possible. For instance, another technology is disclosed which oversamples a bit string of data and conducts signal processing with a digital circuit (refer to Nonpatent Literature 5 and Patent Literature 1).

PRIOR ART LITERATURES

Patent Literature

Patent Literature 1: JP 2005-192192 A
Nonpatent Literature 1: PCI Express Architecture PCI Express Jitter and BER Revision 1.0, 11 Feb. 2005, retrieved on 24 Jan. 2012 from <URL: http://www.pcisig.com/specifications/pciexpress/technicallibrary/PCIe_Rj_DL_BER_R1_0.pdf>
Nonpatent Literature 2: Serial ATA: High Speed Serialized AT Attachment Revision 1.0a, 7 Jan. 2003, retrieved on 24 Jan. 2014 from <URL: http://www.sata-io.org/documents/serialata10a.zip>
Nonpatent Literature 3: Universal Serial Bus Specification Revision 2.0, retrieved on 24 Jan. 2014 from <URL: http://www.usb.org/developers/docs/usb_20_101111.zip>
Nonpatent Literature 4: Designing Bang-Bang PLLs for Clock and Data Recovery in Serial Data Transmission Systems Richard C. Walker, retrieved on 24 Jan. 2014 from <URL: http://www.omnisterra.com/walker/pdfs.papers/BBPLL.pdf>
Nonpatent Literature 5: Multi-Gigabit-Rate Clock and Data Recovery Based on Blind Oversampling, J. Kim, IEEE Communications Magazine, December 2003, p. 68-74

As indicated in Nonpatent Literatures 1 to 3, the CDR with phase interpolator is supposed to use clock sources each having a small clock frequency error between a data transmission side and a data reception side for realizing a short lock time. However, a CR oscillation circuit, which functions as a clock source built in LSI (Large Scale Integration), generally provides a clock frequency error of about 10%. Thus, another clock source such as a crystal oscillator having a small frequency error needs to be provided as an independent body to be separate from an LSI.

Further, as indicated in Nonpatent Literature 4, the CDR with phase synchronization needs a long lock time that is unsuitable for data communications. Furthermore, oversampling each bit of data and subsequent digital processing can shorten a lock time to some extent; however, the effect may be limited. That is, Nonpatent Literature 5 and Patent Literature 1 provide only a technique to use a digital circuit for achieving a feedback loop of PLL (Phase-Locked Loop) realized in an analog circuit; thus, the technique finds a difficulty in shortening a lock time significantly. To be specific, in Nonpatent Literature 5, the number of loop filters for feedback is 512 or more, and the lock time thus needs the number of bits of multiples of 512. Moreover, Patent Literature 1 supposes a clock frequency error of about 1000 [ppm] on the premise that a clock frequency can be estimated when the phase is determined.

SUMMARY

It is an object of the present disclosure to provide a data reception apparatus and a data communication system that determine suitably data received from a data transmission apparatus even with a configuration permitting a data receive-side clock source to have a degree of clock frequency error against a data transmit-side clock source.

In order to achieve the above object, according to a first aspect of the present disclosure, a data reception apparatus is provided as follows. A receive-side clock source is provided to be separate from a transmit-side clock source of a data transmission apparatus that transmits data, and generates a receive clock and outputs the receive clock. An oversampling data generation section generates oversampling data by oversampling each bit of a received bit string that is received from the data transmission apparatus in synchronization with the receive clock inputted from the receive-side clock source. A bit integrated number calculation section calculates an integrated number of bits by integrating a predetermined number of bits in a bit string received from the data transmission apparatus. A sample integrated number calculation section calculates an integrated number of samples by integrating the number of samples corresponding to each bit of the predetermined number of bits integrated by the bit integrated number calculation section, in the oversampling data generated by the oversampling data generation section. A data determination section obtains an approximated line based on a plurality of points each of which indicates correspondence between the integrated number of bits and the integrated number of samples, and determines a bit length in a bit string in the oversampling data generated by the oversampling data generation section based on the approximated line, the bit string corresponding to a segment in which identical values continue in the oversampling data after the integrated number of samples calculated by the sample integrated number calculation section.

In the above configuration, even when the receive-side clock source has a degree of clock frequency error compared with a transmit-side clock source, an approximated line is obtained based on a plurality of points each of which indicates correspondence between the integrated number of bits and the integrated number of samples; obtaining the approximated line results in obtaining accurately the number of samples per one bit of a bit string with an accuracy higher than the oversampling period (inverse of the number of samples). Once the number of samples per one bit of a bit string is obtained, the number of samples per one bit is then used to divide the number of data of a segment where identical values continue in the oversampling data; thereby, a bit length of a bit string corresponding to the segment can be determined and the data can be determined suitably. That is, the approximated line which indicates the correspondence between the integrated number of bits and the integrated number of samples is obtained from the bit string received in the past; our attention is paid to the technical feature of the correspondence between the integrated number of bits and the integrated number of samples following the approximated line. Thus, the data can be determined suitably without being affected by the frequency error.

BRIEF DESCRIPTION OF DRAWINGS

The above and other objects, features and advantages of the present disclosure will become more apparent from the following detailed description made with reference to the accompanying drawings as follows.

FIG. 1 is a functional block diagram according to a first embodiment of the present invention;

FIGS. 5A and 5B are diagrams equivalent to FIGS. 2A and 2B;

FIGS. 6A, 6B, and 6C are diagrams each illustrating the correspondence between the integrated number of bits and the integrated number of samples;

FIG. 24 is a diagram illustrating a calculation result of the number of samples per 1 bit with a table.

EMBODIMENTS FOR CARRYING OUT INVENTION

First Embodiment

Figure 2A:
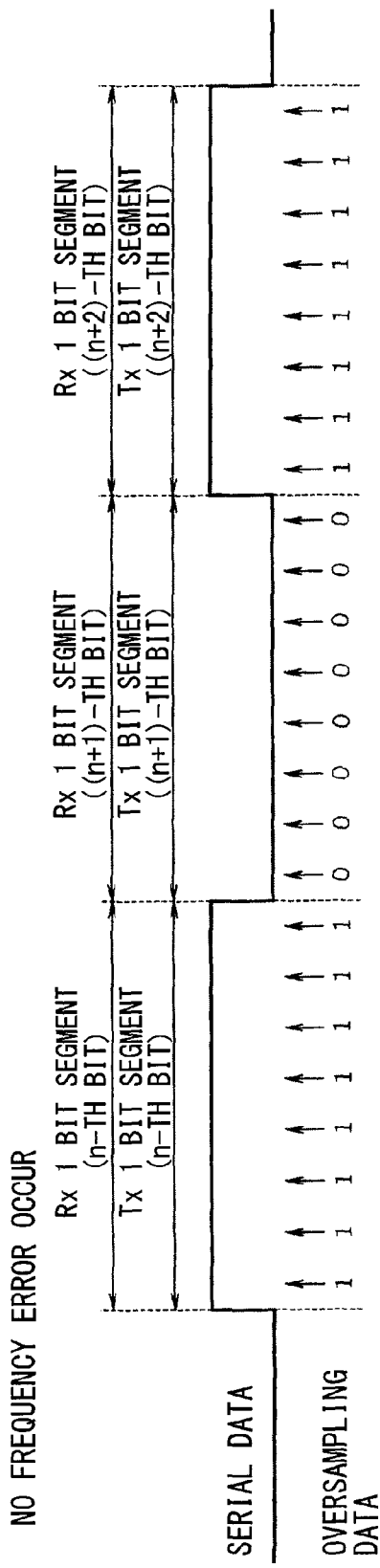
FIGS. 2A and 2B are diagrams each illustrating oversampling data.
Figure 2B:
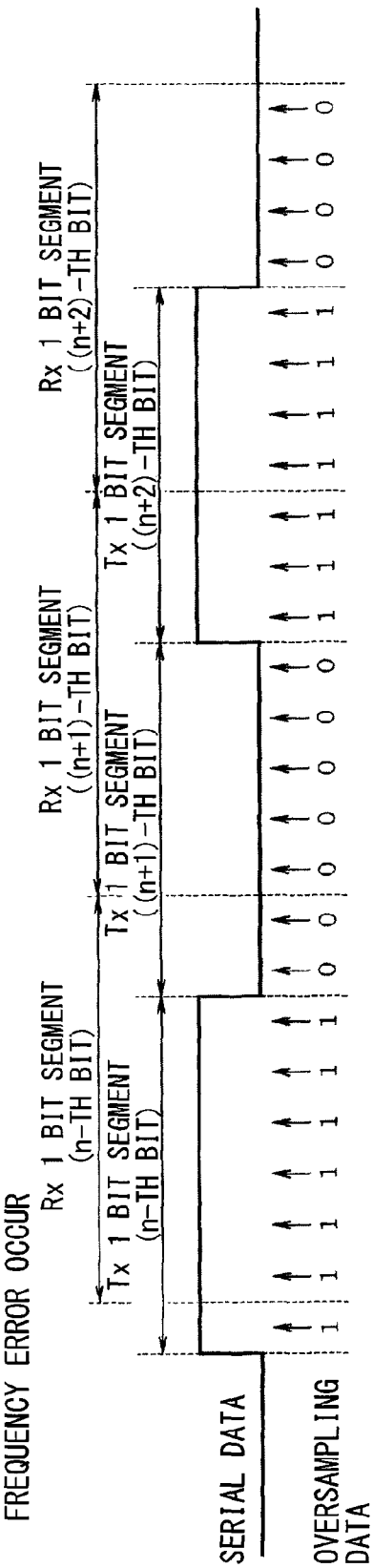

The following will explain a first embodiment according to the present disclosure with reference to FIGS. 1 to 10. The data communications explained in the present embodiment are applied to communications between LSIs (Large Scale Integration) in a single ECU (Electronic Control Unit) mounted in a vehicle, or communications between LSIs in different ECUs mounted in a vehicle, for instance. A data communication system 1 communicates between LSIs and includes a data transmission apparatus 2 that transmits data and a data reception apparatus 3 that receives data.

The data transmission apparatus 2 includes a transmit-side clock source 4 and a serializer 5. The transmit-side clock source 4 includes a CR oscillation circuit to generate a transmit clock, and outputs it to the serializer 5. The serializer 5 first receives parallel data that is to be transmitted to the data reception apparatus 3, and then synchronizes the received parallel data with the transmit clock inputted from the transmit-side clock source 4 for parallel-to-serial conversion to generate serial data. The serializer 5 transmits the generated serial data to the data reception apparatus 3 via a communication line.

The data reception apparatus 3 includes a receive-side clock source 6, a deserializer 7 (referred to as an oversampling data generation section or oversampling data generation means), and a data determination circuit 8. The receive-side clock source 6 includes a CR oscillation circuit, like the transmit-side clock source 4, to generate a receive clock, and outputs it to the deserializer 7 and the data determination circuit 8. When receiving the serial data via the communication line from the data transmission apparatus 2, the deserializer 7 oversamples the received serial data in synchronization with the receive clock inputted from the receive-side clock source 6 to generate oversampling data, and outputs the generated oversampling data to the data determination circuit 8. If the present data communications belong to general ones, the deserializer 7 uses desirably a multiple of 5 to 10 for oversampling one bit; a multiple is the number of samples per 1 bit. In FIG. 1, the receive-side clock source 6 outputs the receive clock directly to deserializer 7 and the data determination circuit 8. Without need to be limited thereto, the receive-side clock source 6 may output the receive clock via a PLL (Phase-Locked Loop) circuit etc. Moreover, in order to compensate the clock delay in the deserializer 7, a receive clock may be first inputted to the deserializer 7 and inputted to the data determination circuit 8 after passing through the deserializer 7.

The data determination circuit 8 includes a data determination section 9 (also referred to a data determination means), a bit integrated number calculation section 10 (also referred to as a bit integrated number calculation means), and a sample integrated number calculation section 11 (also referred to as a sample integrated number calculation means). The data determination section 9 first receives oversampling data from the deserializer 7 and then synchronizes the received sampling data with the receive clock inputted from the receive-side clock source 6 to conduct serial-to-parallel conversion and generate parallel data to output it (reproducing data which are identical to or shifted from the parallel data which the serializer 5 of the data transmission apparatus 2 receives). The bit integrated number calculation section 10 calculates the integrated value obtained by integrating the number of bits in the bit string as an integrating number of bit (also referred to as a bit count). The sample integrated number calculation section 11 calculates the integrated value obtained by integrating the number of samples that the deserializer 7 obtains by oversampling each of the bits of the received bit string, as an integrated number of samples (also referred to as a sample count).

The present embodiment explains the case where each of the transmit-side clock source 4 and the receive-side clock source 6 is built in an LSI. Without need to be limited thereto. The clock sources 4, 6 may be provided as independent bodies to be separate from LSIs (provided outside of LSI). When being provided as an independent body, the clock source may include a crystal oscillator that provides a higher accuracy than a CR oscillation circuit. Moreover, the frequency of the transmit clock outputted from the transmit-side clock source 4 and the frequency of the receive clock outputted from the receive-side clock source 6 need not be identical to each other or integral multiples of each other. The frequency of the receive clock only needs to be a frequency that permits the deserializer 7 to oversample one bit.

The following explains operations in the present embodiment with reference to FIGS. 2 to 10. The frequency of the transmit clock outputted from the transmit-side clock source 4 and the frequency of the receive clock outputted from the receive-side clock source 6 will be explained first. When any frequency error (offset) does not occur between both sides, a 1-bit segment of a bit string of the receive-side and a 1-bit segment of a bit string of the transmission side accord with each other without deviated. That is, as indicated in FIG. 2A, when one bit is oversampled with eight samples (8 times), the 1-bit segment of the transmission side accords with oversampling data of eight samples of the reception side. The sampling-data string having continuous n identical values ("0" or "1") is determined to be corresponding to 1 bit (i. e., a 1-bit segment). Herein, "n" is 8.

In contrast, when a frequency error (offset) occurs between both sides, a 1-bit segment of a bit string of the reception side and a 1-bit segment of a bit string of the transmission side may be deviated from each other and not accord with each other. That is, with reference to FIG. 2B, when one bit is oversampled with eight samples (8 times) like in FIG. 2A, the 1-bit segment of the transmission side may be deviated to the oversampling data of seven bits without corresponding to the oversampling data of eight samples of the reception side, for instance.

Figures 3, 4:
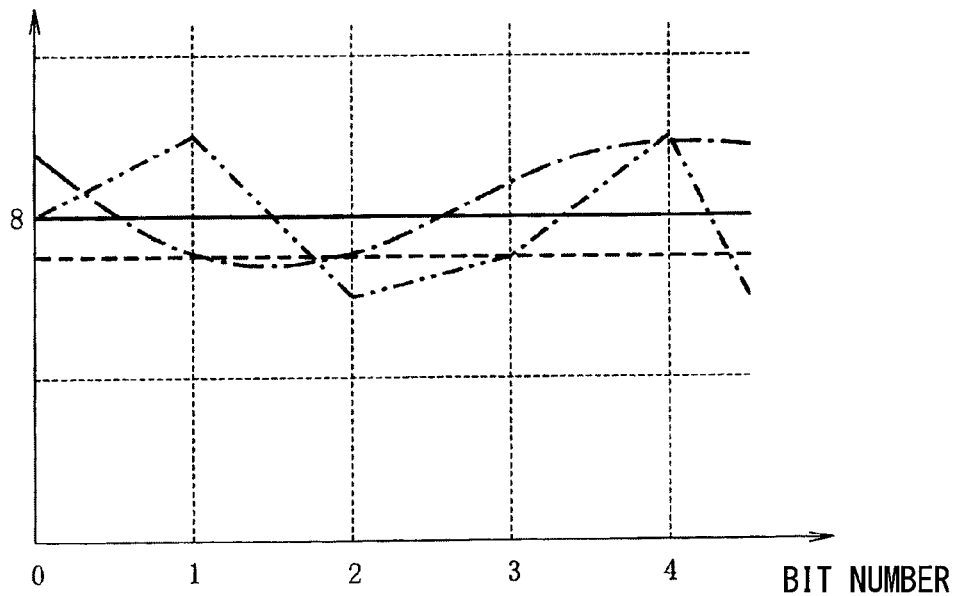
FIG. 3 is a diagram illustrating the number of samples versus a degradation factor with a table.
FIG. 4 is a diagram illustrating a bit number and the number of samples with a graph.

Thus, the frequency error works as a degradation factor which causes a deviation between a 1-bit segment of the transmission side and a 1-bit segment of the reception side. Other than the frequency error, a periodic jitter or a random jitter may work as a degradation factor. FIG. 3 indicates examples of change in the number of samples per 1 bit depending on respective degradation factors. When no degradation factors occurs, the number of samples per 1 bit becomes constant at a normal number of samples per 1 bit, as shown in "A", (eight samples per 1 bit in FIG. 3, for example). In contrast, when a frequency error occurs as a degradation factor, the number of samples per 1 bit becomes constantly deviated by a predetermined number of samples from the normal number of samples, as shown in "B", (six samples in FIG. 3, for example). Moreover, when a periodic jitter like a sine wave occurs as a degradation factor, the number of samples per 1 bit becomes deviated in a sine waveform from the normal number of samples, as shown in "C". Further, when a random jitter occurs as a degradation factor, the number of samples per 1 bit becomes deviated randomly from the normal number of samples, as shown in "D". Furthermore, when all the above-mentioned frequency error, the periodic jitter, and the random jitter occur as degradation factors (similar to a practical state) to influence on average, the number of samples per 1 bit becomes averaged as shown in "E". In truth, the number of samples per 1 bit is discretized by oversampling; thereby, the number of samples per 1 bit becomes discretized as shown in "F". FIG. 4 indicates variations of the number of samples per 1 bit when each degradation factor indicated in FIG. 3 occurs. It is noted that numerical values indicated in FIG. 4 differ from those in FIG. 3.

Suppose that a received bit string received from the data transmission apparatus 2 provides a regularly arranged pattern that bit-by-bit alternates "0" and "1" such as "0", "1", "0", "1". In such a case, even when the above-mentioned degradation factor occurs, the data determination circuit 8 can determine a value (polarity) of each bit. However, in fact, a received bit string received from the data transmission apparatus 2 provides an irregularly arranged pattern of "0" and "1". Therefore, the data determination circuit 8 cannot determine a value of each bit for the following reasons when the above-mentioned degradation factor occurs.

With reference to FIG. 3, when the periodic jitter or random jitter occurs, the number of samples per 1 bit is changed from six to ten. When oversampling data having several identical values continue within a segment, the data determination circuit 8 becomes disabled to determine a bit length of the data in the segment (how many bits the segment corresponds to). To be specific, suppose a case that 19 samples having identical values of "1" continue in the oversampling data, for example. Such a case may cause two possibilities. The first possibility is as illustrated in FIG. 5A, in which a random jitter causes 18 samples to seem to be 19 samples; 18 samples originally consist of three continuous bits of which each bit has 6 samples. The second possibility is as illustrated in FIG. 5B, in which a random jitter causes 20 samples to seem to be 19 samples; 20 samples originally consist of two continuous bits of which each bit has 10 samples. Under the above possibilities being supposed, the data determination circuit 8 may try to determine a bit length of the data (with a conventional technique) using the oversampling data as it is inputted from the deserializer 7. In this case, the data determination circuit 8 cannot determine whether the oversampling data consisting of 19 samples correspond to the data of 2 bits or the data of 3 bits.

To that end, in the present embodiment, the data determination circuit 8 performs the following. That is, the data determination circuit 8 integrates the numbers of bits of the bit string with the bit integrated number calculation section 10 to thereby obtain an integrated number of bits. The data determination circuit 8 obtains an integrated number of samples by integrating the numbers of samples obtained by oversampling each of the bits with the sample integrated calculation section 11 to thereby obtain an integrated number of samples. The data determination circuit 8 obtains an approximated line (fitting straight line) that indicates correspondence between the integrated number of bits and the integrated number of samples. Refer to FIG. 6A. When oversampling each bit with 8 samples, for instance, each bit is processed with normal 8 samples if any degradation factors do not arise. As indicated with the solid line, the integrated number of samples becomes a straight line that indicates the value obtained by multiplying the integrated number of bits by eight so that the integrated number of bits is directly proportioned with the integrated number of samples. In contrast, the following is the case when a frequency error occurs as a degradation factor. In processing each bit with 6 samples, for instance, as indicated with the dotted line, the integrated number of samples serves as a straight line which indicates the value obtained by multiplying the integrated number of bits with six. In processing each bit with 12 samples, for instance, as indicated with the alternate long and short dash line, the integrated number of samples becomes the value obtained by multiplying the integrated number of bits with twelve. The above two lines deviate from the straight line that indicates the values that are obtained by multiplying the integrated number of bits by eight.

Moreover, refer to FIG. 6B. When oversampling each bit with 8 samples, for instance, a periodic jitter like a sine wave may occur as a degradation factor. In this case, as indicated with the dotted line, the integrated number of samples serves as a line e.g., as sine wave, which deviates from the straight line indicating the value obtained by multiplying the integrated number of bits with eight. Further, with reference to FIG. 6C. When oversampling each bit with eight samples, for instance, a random jitter may occur as a degradation factor. In this case, as indicated with the dotted line, the integrated number of samples serves as a line, which deviates randomly from the straight line indicating the value obtained by multiplying the integrated number of bits with eight. Furthermore, all the degradation factors of the frequency error, the periodic jitter, and the random jitter may occur (like a practical state) and influence on an average. Even in this case, the approximated line, which indicates correspondence between the integrated number of bits and the integrated number of samples, may be obtained with a similar manner.

Next, how to obtain an approximated line will be explained. An approximated line is generally obtained through a straight line approximation with the least squares technique using as parameters a plurality of points that indicate the correspondence between the integrated number of bits and the integrated number of samples. It is noted that the approximated line may be obtained through another method, which will be explained later. In this case, a slope of the approximated line signifies how many samples 1 bit corresponds to (i.e., the number of samples per 1 bit). For instance, when 1 bit is oversampled with 8 samples, the accuracy of positions which are obtained by oversampling a bit is only one eighth (⅛) that is the sampling period being inverse of the number of samples per 1 bit. In contrast, acquisition of the approximated line using a plurality of bits (i.e., fitting of a plurality of bits) can provide an advantageous effect to permit the determination of the number of samples per 1 bit with an accuracy higher than one eighth of the sampling period that is inverse of the number of samples per 1 bit.

Figure 7:
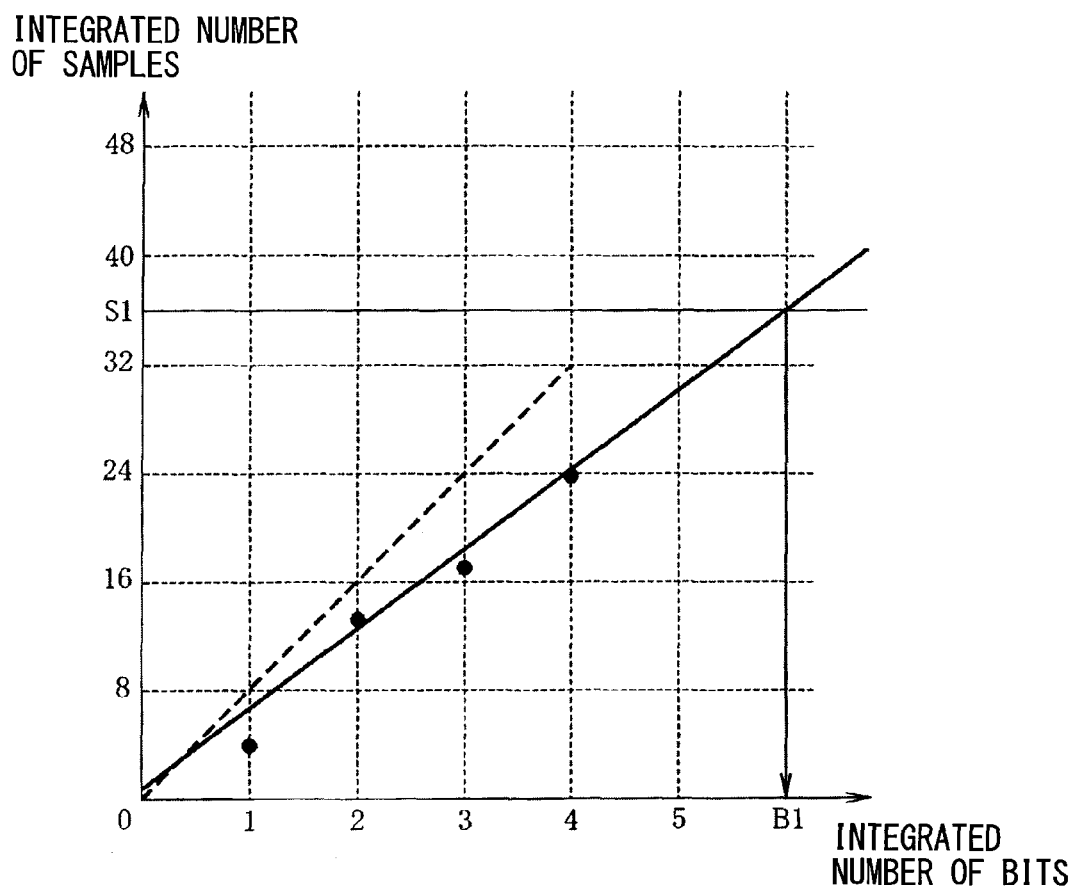
FIG. 7 is a diagram illustrating an approximated line.

The following will explain a segment for which an approximated line is obtained. The segment for which an approximated line is obtained may use the segment of a preamble. FIG. 7 indicates an example of obtaining an approximated line using the segment of a preamble. Start of data communication generally transmits as a preamble a regular pattern of about 10 bits of "0", "1", "0", "1," . . . . The segment of the preamble containing respective known bits may be used for obtaining an approximated line; this permits the determination of the value of each bit of data containing respective unknown bits transmitted after the preamble.

That is, FIG. 7 indicates the case where a preamble contains four bits. The integrated number of samples is calculated up to each of the first bit, the second bit, the third bit, and fourth bit, respectively. The integrated number of bits is taken as an axis of abscissa while the integrated number of samples is taken as an axis of ordinate. Four points that indicate the correspondence between the integrated number of bits and the integrated number of samples are plotted to obtain an approximated line with the least squares technique. Then, a segment in which identical values of bits continue is obtained from a bit string after the fourth bit (data following the preamble). The number of samples in the oversampling data of the string of the continuous bits is obtained. In this case, the values of the oversampling data in the string of the continuous bits are identical. The integrated number of bits is obtained which corresponds to the integrated number of samples that includes the number of samples after the fourth bit. This permits the determination of a bit length of the data in the segment. In other words, suppose that the integrated number of samples is "S1". "B1" is obtained which is the integrated number of bits corresponding to "S1" of the integrated number of samples on the approximated line. This permits the determination of a bit length of the data in the segment.

The approximated line (first obtained) is obtained using the segment of the preamble at start of data communication. The first obtained approximated line may be used to determine a bit length of the data following the preamble. In contrast, For example, a periodic jitter like sine wave continues to vary the number of samples per 1 bit; thus, the approximated line is desirably updated continuously to response to the variation in the number of samples. Even in other than the preamble, the approximated line may be obtained using a segment of the data containing known values of bits.

Figure 8:
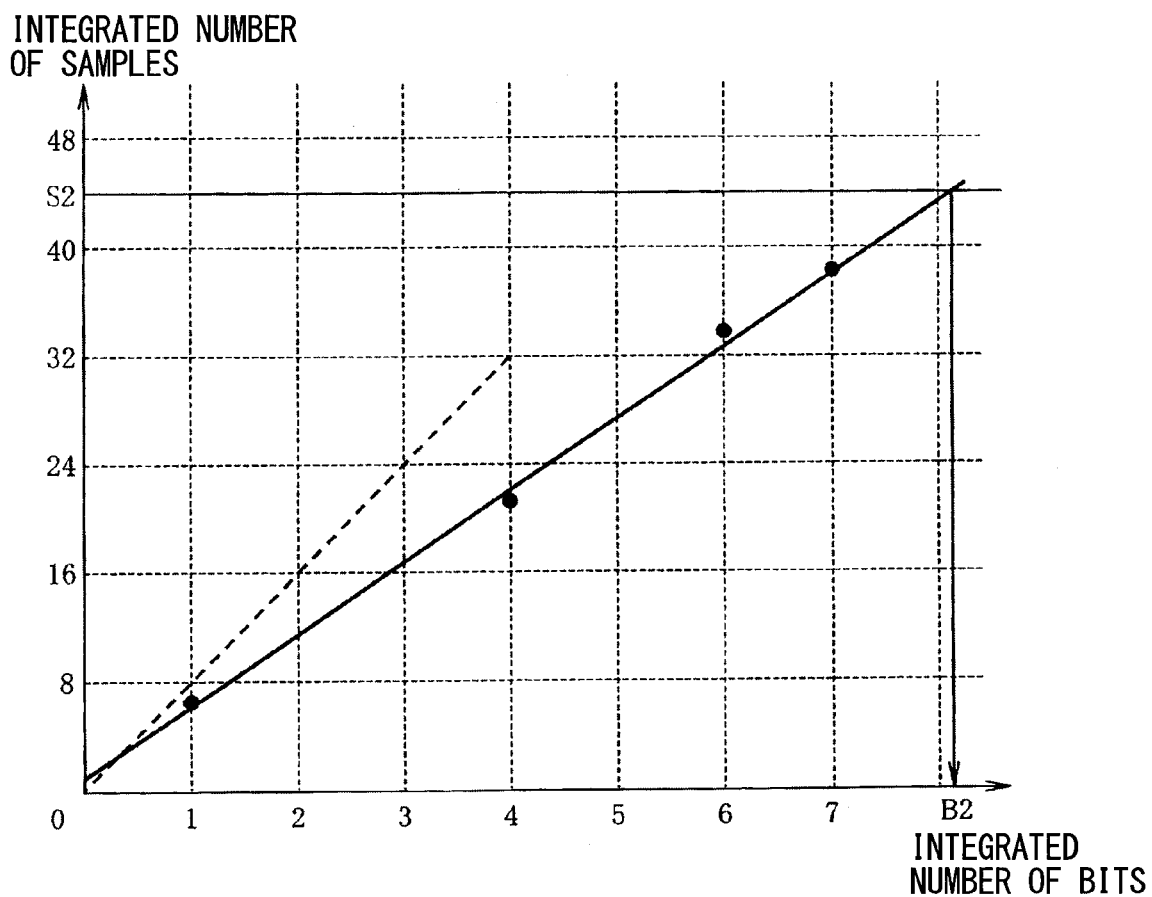
FIG. 8 is a diagram equivalent to FIG. 7.

Refer to FIG. 8 that indicates the bit string of "0", "1", "1", "1", "0", "0", and "1", where continuous identical values of bits appear by 1 bit, 3 bits, 2 bits, and 1 bit, for instance. The integrated number of samples is calculated up to each of the first bit, the fourth bit, the sixth bit, and seventh bit, respectively. The integrated number of bits is taken as an axis of abscissa while the integrated number of samples is taken as an axis of ordinate. Four points are plotted which indicate correspondence between the integrated number of bits and the integrated number of samples to thereby obtain an approximated line with the least squares technique. A segment where identical values of bits continue is obtained from the bit string following the seventh bit. The number of samples in the oversampling data of the string of the continuous bits is obtained. The integrated number of samples corresponding to the number of samples is obtained based on the approximated line. This permits the determination of a bit length of the data in the segment. In other words, suppose that the integrated number of samples is "S2". "B2" is obtained which is the integrated number of bits corresponding to "S2" of the integrated number of samples on the approximated line. This permits the determination of a bit length of the data in the segment. It is noted that "B2" is not always an integer but may be a number with a fractional part. An integer is specified which is nearest to the number with a fractional part; this permits the determination of a bit length in the data.

Figures 9A, 9B:
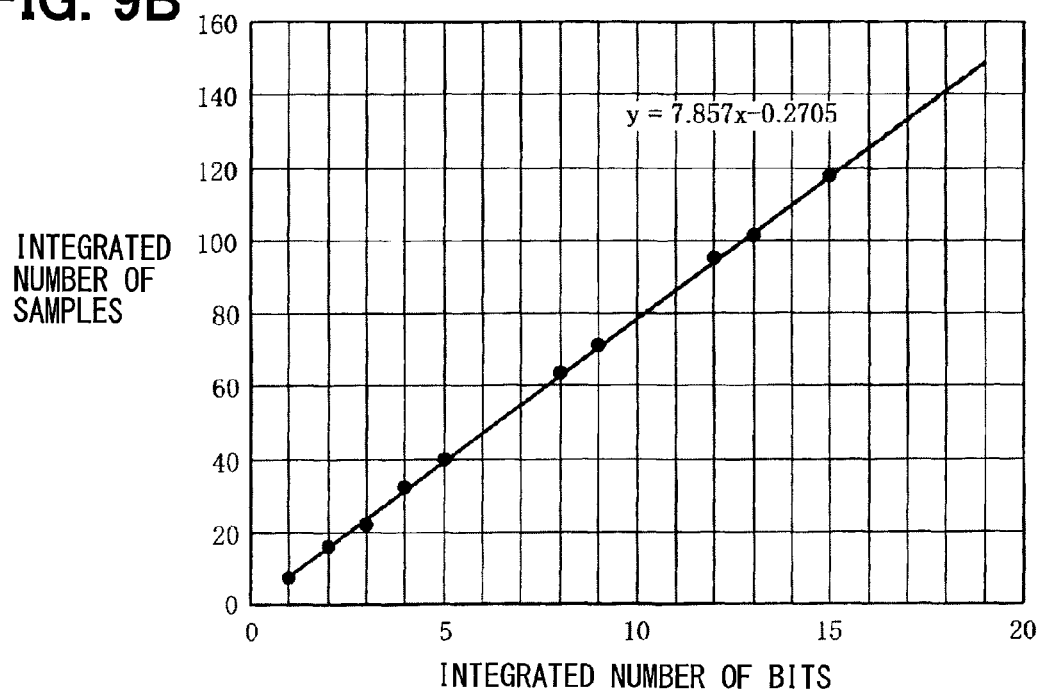
FIG. 9A is a diagram illustrating the correspondence between the integrated number of bits and the integrated number of samples and FIG. 9B is a diagram illustrating an approximated line.

A specific example will be explained with reference to FIGS. 9A and 9B. The deserializer 7 carries out oversampling 1 bit with 10 samples (10 times). As indicated in FIG. 9A, the data determination circuit 8 calculates the integrated number of bits with the bit integrated number calculation section 10, calculates the integrating number of samples with the sample integrated number calculation section 11, and obtains 10 points. The preamble corresponds to the segment from the first bit to the fifth bit in the bit string. The data corresponds to the segment from the sixth bit in the bit string. Subsequently, the data determination circuit 8 plots 10 points that indicates correspondence between the integrated number of bits and the integrated number of samples, and obtains an approximated line with the least squares technique.

The integrated number of bits is set to "xn", the integrated number of samples is set to "yn", and 10 points are set to (x1, y1), (x2, y2), . . . , (xn, yn), wherein n is a natural number. An approximated line is then obtained with the least squares technique based on the calculation expressions as follows.

[Expressions 1]

$$y = ax + b \quad (1)$$

$$a = \frac{n\sum_{i=1}^{n} x_i y_i - \sum_{i=1}^{n} x_i \sum_{i=1}^{n} y_i}{n\sum_{i=1}^{n} x_i^2 - \left(\sum_{i=1}^{n} x_i\right)^2} \quad (2)$$

$$b = \frac{\sum_{i=1}^{n} x_i^2 \sum_{i=1}^{n} y_i - \sum_{i=1}^{n} x_i y_i \sum_{i=1}^{n} x_i}{n\sum_{i=1}^{n} x_i^2 - \left(\sum_{i=1}^{n} x_i\right)^2} \quad (3)$$

In the present embodiment, n=10.

$$y = 7.857x - 0.2705 \quad (4)$$

is obtained.

Suppose the case where 15 samples having identical values continue in the oversampling data following the fifteen bit in the bit string. The integrated number of samples including "15" of the number of samples having identical values becomes "132" that is obtained by adding "15" to "117" that is the integrated number of samples up to the 15th bit in the bit string. When y=132 is substituted for the above-mentioned expression (4), x=16.835 is obtained. Therefore, "17" that is the natural number nearest to "16.835" is obtained as the integrated number of bits corresponding to "132" of the integrated number of samples. The bit length corresponding to the segment where the oversampling data contain identical values following the fifteenth bit in the bit string is obtained as "2" that is obtained by subtracting "15" that is the immediately previous integrated number of bits from "17" that is obtained based on the approximated line. That is, it is determined that 15 samples containing identical values continue in the oversampling data correspond to the data of 2-bit length.

Figure 10:
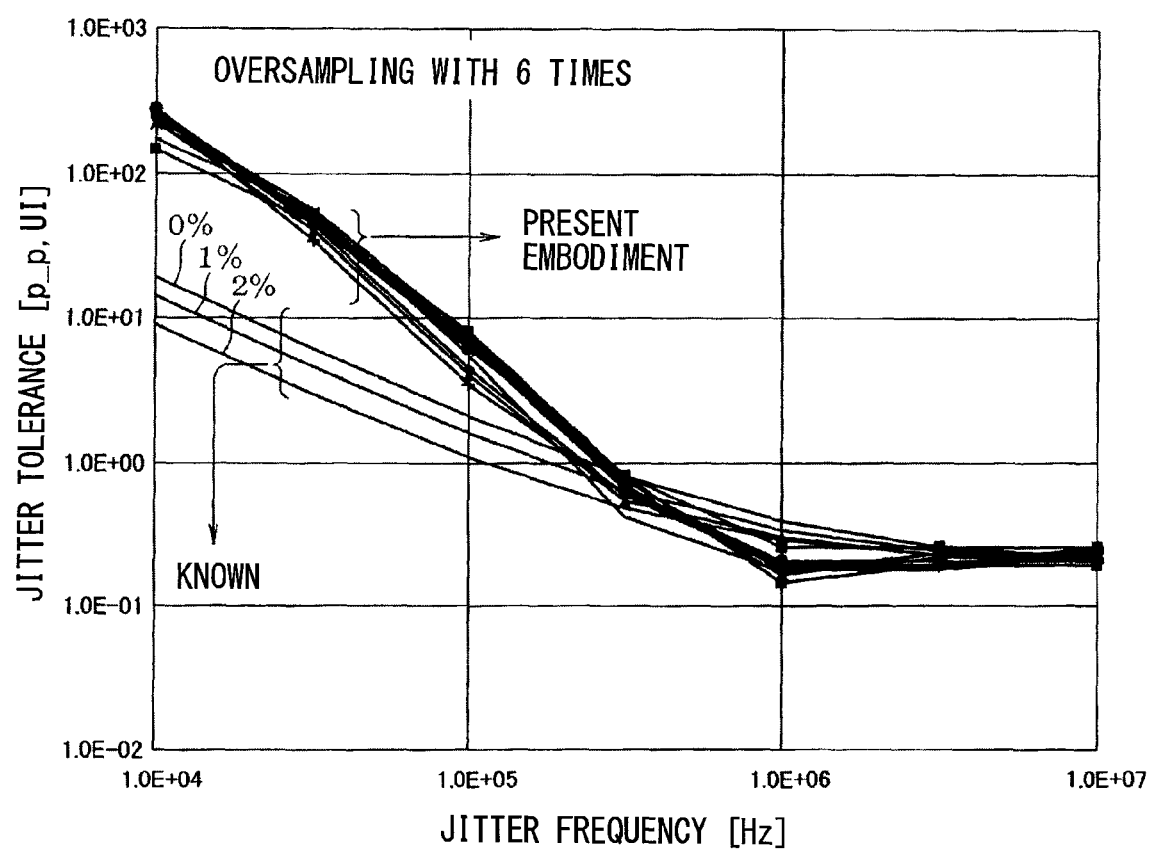
FIG. 10 is a diagram illustrating a result from simulation of jitter tolerance.

FIG. 10 indicates the result from the simulation as advantageous effects of the present embodiment. The data communication speed is 16 [Mbps]. The results are indicated when the frequency errors of ±3%, ±9%, ±12%, and ±20% occur, respectively. The straight line fitting with the least squares technique is applied to immediately previous 9 points. Moreover, a comparative object is indicated simultaneously; the comparative object presents theoretical characteristics when the frequency errors of 0%, 1%, 2% occur, respectively, in CDR of the phase interpolation system (CDR of the phase synchronization system cannot lock with the frequency error of 3%). The result from the simulation indicates the following. That is, although undergoing the frequency error of a degree of ±20%, the present embodiment provides a jitter tolerance (jitter resistance) having a value higher than that of CDR of the well-known phase interpolation system at the jitter frequencies lower than $1.0 \times 10^5$ [Hz].

As explained above, according to the first embodiment, the data reception apparatus 3 obtains an integrated number of bits by integrating the numbers of bits of a bit string, obtains an integrated number of samples by integrating the numbers of samples obtained by oversampling each of the bits, obtains an approximated line that indicates correspondence between the integrated number of bits and the integrated number of samples, determines, based on the approximated line, a bit length of a bit string corresponding to a segment in which the oversampling data contains identical values continuing after the number of samples integrated. Thus, even when the receive-side clock source 6 has a degree of clock frequency error compared with a transmit-side clock source 4, how many samples 1 bit of the bit string corresponds to can be obtained with an accuracy higher than a period of oversampling (inverse of the number of samples per 1 bit). Once the number of samples per 1 bit of a bit string is obtained, the number of samples per 1 bit is then used to divide the number of data of a segment where identical values continue in the oversampling data; thereby, a bit length corresponding to the segment can be determined to suitably determine the data. That is, unlike a conventional method, the approximated line which indicates the correspondence between the integrated number of bits and the integrated number of samples is obtained from the bit string received in the past; our attention is paid to the technical feature of the correspondence between the integrated number of bits and the integrated number of samples in the data, whose values are to be determined, following the approximated line. The data can be thus determined suitably, without being affected by the degradation factors, such as a frequency error, a periodic jitter, or a random jitter.

Moreover, the approximated line is obtained with the least squares technique; the approximated line can be easily obtained in accordance with a well-known general-purpose technique. Furthermore, the approximated line is obtained using a segment of a preamble; it is not necessary to prepare a specific bit string for obtaining the approximated line and the preamble can be used effectively.

Second Embodiment

The following will explain a second embodiment according to the present disclosure with reference to FIGS. 11 to 14.

Figure 11:
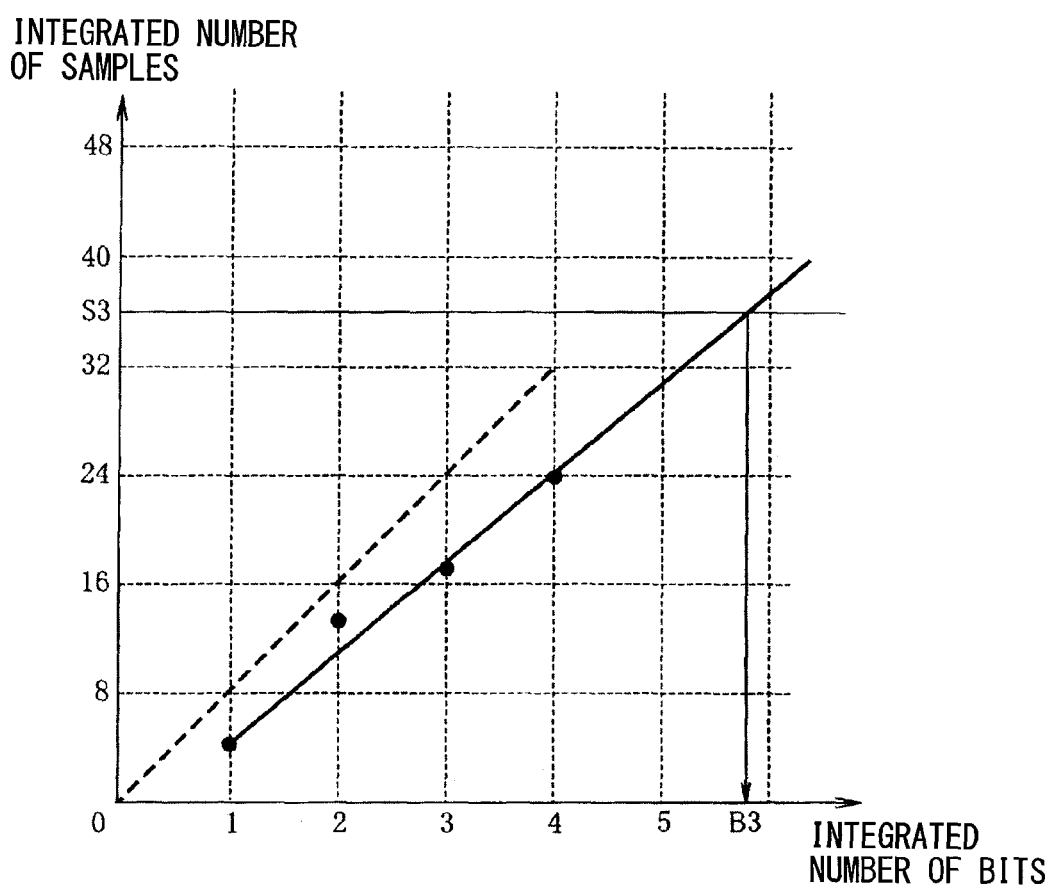
FIG. 11 is a diagram equivalent to FIG. 7, according to a second embodiment of the present disclosure.

The first embodiment obtains an approximated line through straight line approximation with the least squares technique taking a plurality of points as parameters. The second embodiment obtains an approximated line through straight line approximation using both end points among a plurality of points. That is, as indicated in FIG. 11, an approximated line is obtained as a straight line that connects the first bit being the smallest-numbered bit with the fourth bit being the largest-numbered bit among the plurality of points. In this case, suppose that the integrated number of samples is "S3". "B3" is obtained which is the integrated number of bits corresponding to "S3" of the integrated number of samples on the approximated line. This permits the determination of a bit length of the data in the segment.

An approximated line is obtained based on the calculation expressions as below. Here, an integrated number of bits is defined as "xn", an integrated number of samples is defined as "yn", and the point of the first bit is defined as (x1, y1) while the point of the n-th bit is defined as (xn, yn).

[Expressions 2]

$$y = ax + b \quad (5)$$

$$a = \frac{yn - y1}{xn - x1} \quad (6)$$

$$b = \frac{xny1 - x1yn}{xn - x1} \quad (7)$$

The method of obtaining an approximated line with straight line interpolation can simplify the calculation as compared with the method of obtaining an approximated line with the least squares technique.

Figure 12:
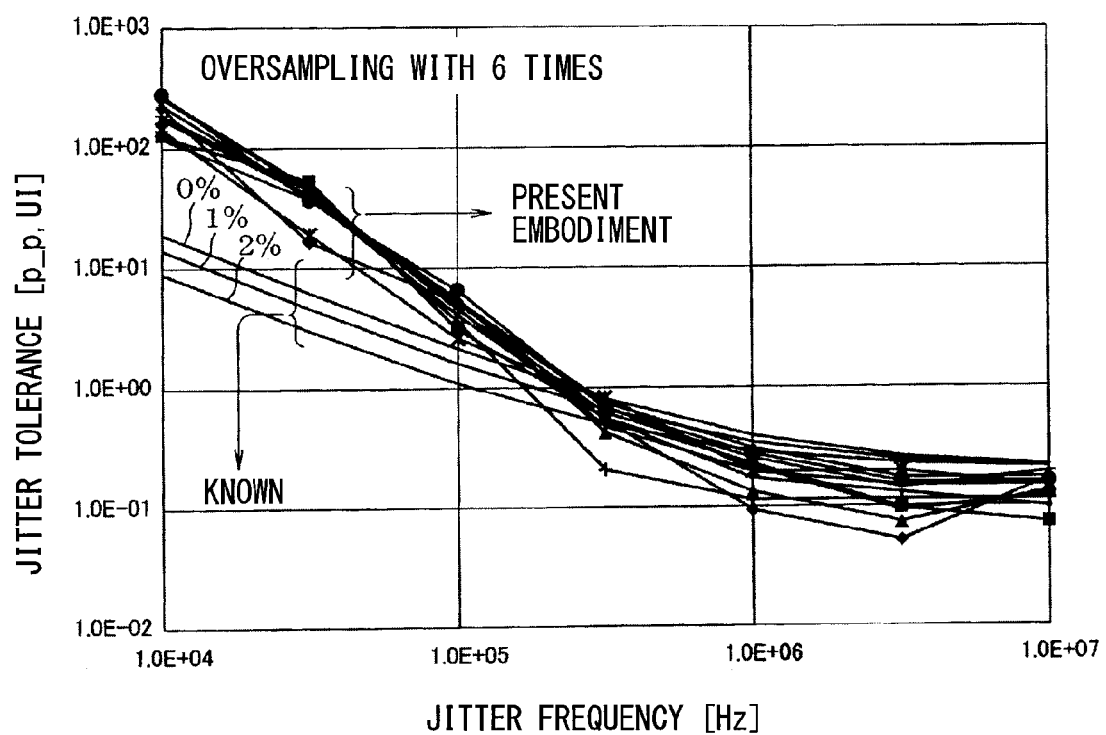
FIG. 12 is a diagram equivalent to FIG. 10.
Figure 13:
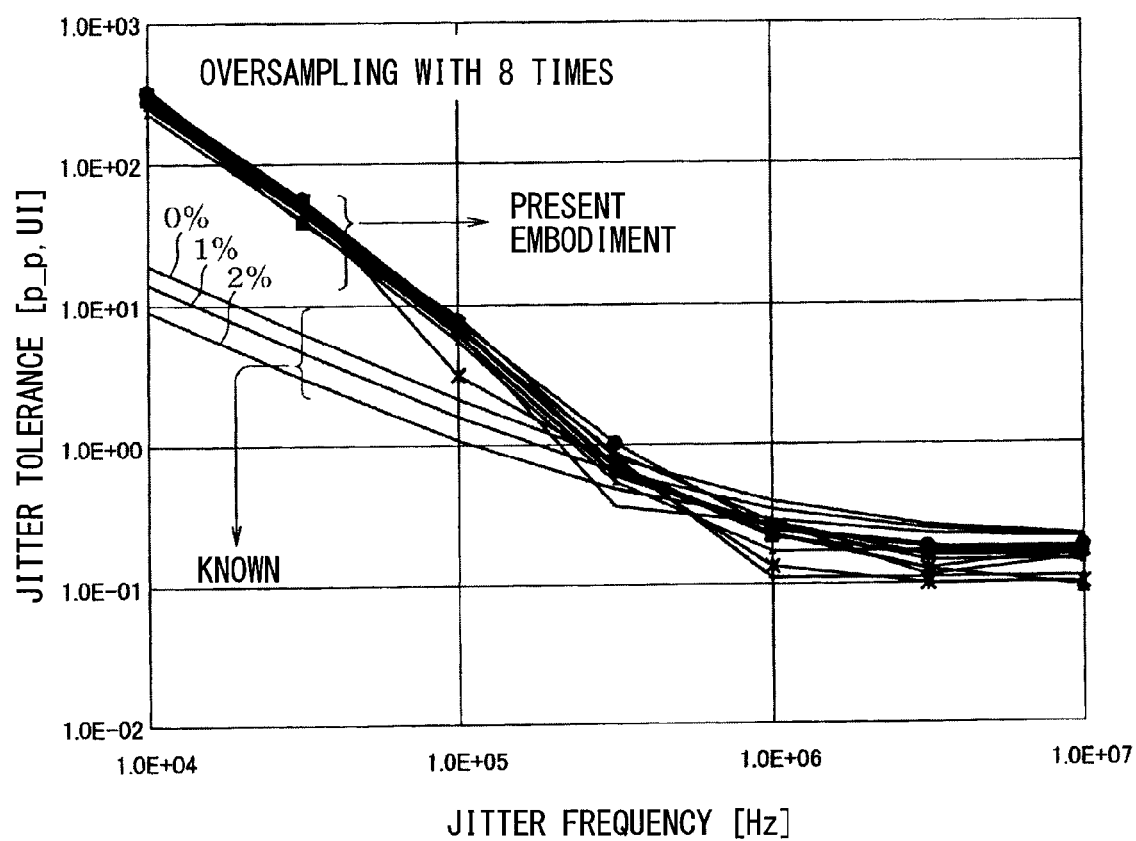
FIG. 13 is a diagram equivalent to FIG. 10.
Figure 14:
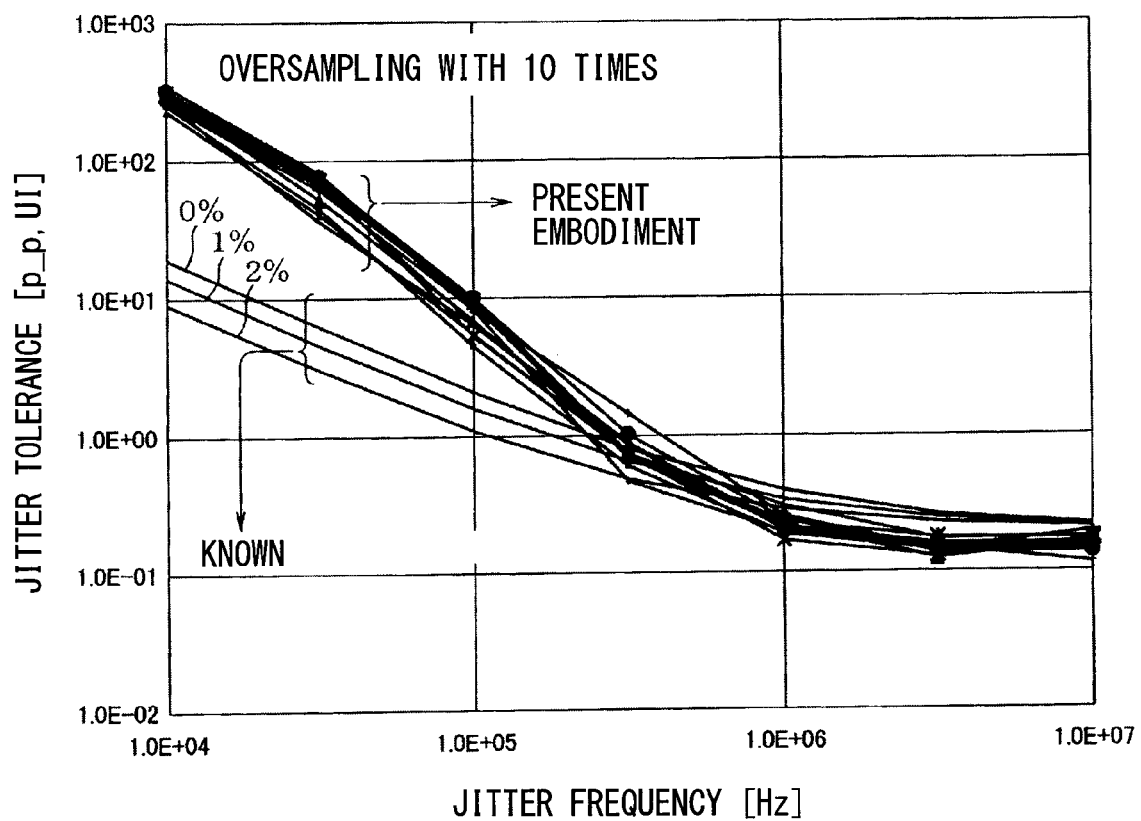
FIG. 14 is a diagram equivalent to FIG. 10.

FIGS. 12 to 14 indicate the results from the simulation as advantageous effects of the present embodiment like the first embodiment. In this case, the data communication speed is also 16 [Mbps]. It is supposed that frequency errors of 0%, ±3%, ±9%, ±12%, and ±20% occur. Straight line fitting with the least squares technique is applied to immediately previous 9 points. Parameters are 6 samples, 8 samples, and 10 samples. As the number of samples increases, the characteristic is improved more. The number of samples may be selected as needed according to the frequency error. General data communications may select the number of samples as 6 to 10.

Third Embodiment

Figure 15:
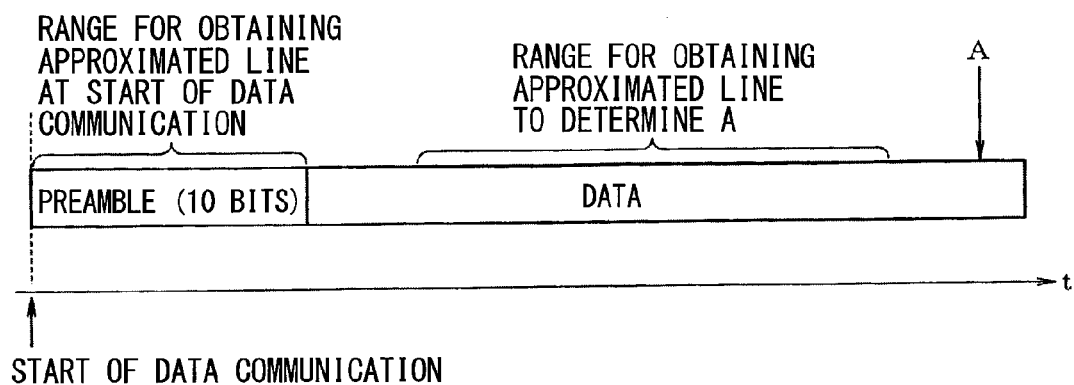
FIG. 15 is a diagram illustrating a third embodiment of the present disclosure.

The following will explain a third embodiment according to the present disclosure with reference to FIG. 15.

The third embodiment obtains an approximated line with a plurality of points that are variable. For instance, there may be a case where when data communications resume from the interrupted state, a few earlier bits (e.g., about 1 bit) of a bit string of a preamble may be missing before the operation (receive clock) of the data reception apparatus 3 becomes stable. For such a case, the data determination circuit 8 may obtain an approximated line by using points corresponding to the bits excluding a predetermined number of bits (e.g., earlier 1 bit) from the start of the preamble. Several bits from the starting bit of the bit string of a preamble may be missing. Even in such a case, the above configuration can eliminate the influence and stabilize the data communications.

Moreover, for instance, when a preamble contains 10 bits, the number of points usable for obtaining an approximated line at the start of the data communication is 10 points at maximum. This number of points used for obtaining an approximated line may be increased as the data communication progresses. That is, as indicated in FIG. 15, at the start of data communication, an approximated line is obtained using 10 points equivalent to the bit string of the preamble. In consideration of the noise resistance of the communication line which transmits the data, an approximated line may be obtained using 10 or more points equivalent to the bit string of the data as the data communication progresses. Moreover, when the number of points used for obtaining an approximated line is increased infinitely, the size of the circuit may be increased undesirably. To that end, the number of points may be saturated around less than 100 (i.e., less than a threshold bit number in a bit string), for instance, and then maintained to be constant. This configuration can prevent an unsuitable increase in the size of the circuit. Furthermore, an approximated line may be obtained using the points near the data of which value is desired to be determined. The obtained approximated line is used for determining a bit length. This configuration permits the determination of a bit length after reflecting a degradation factor arising closely as much as possible.

Fourth Embodiment

Figure 16:
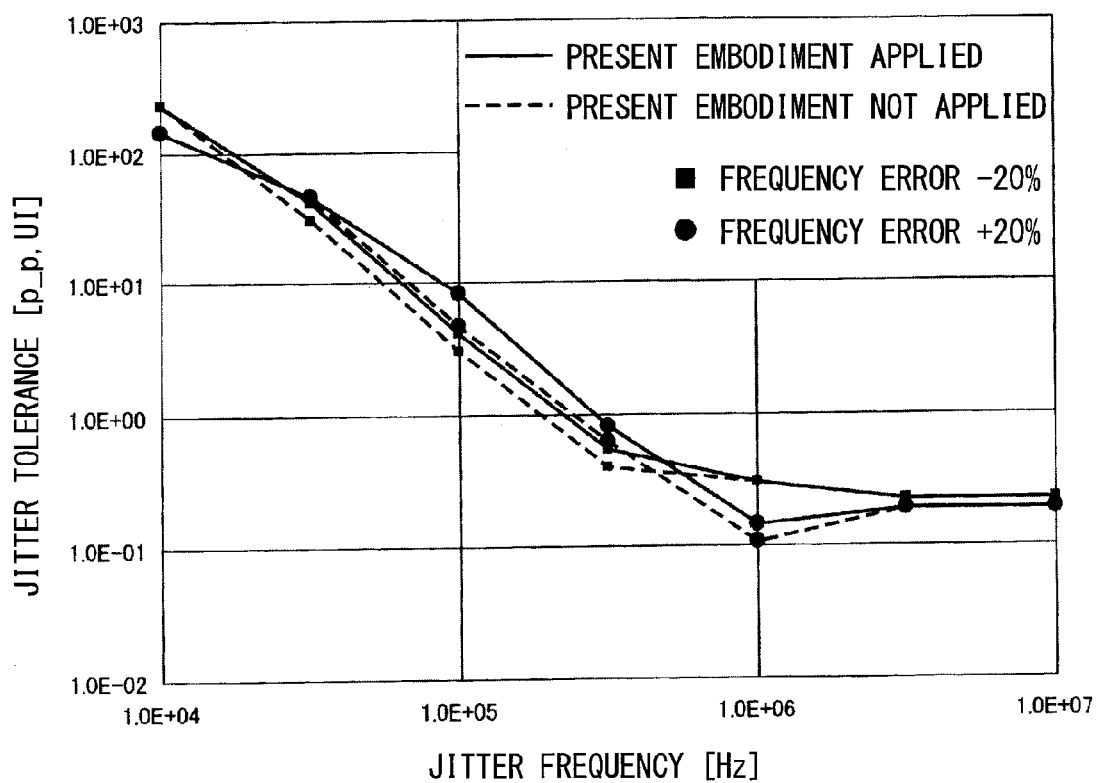
FIG. 16 is a diagram equivalent to FIG. 10, according to a fourth embodiment of the present disclosure.

The following will explain a fourth embodiment according to the present disclosure with reference to FIG. 16.

The first to third embodiments perform a division as well as a multiplication in obtaining an approximated line. In contrast, the fourth embodiment uses only a multiplication circuit to perform an equivalent process.

In each of the first embodiment and the second embodiment, an object of an approximated line is to obtain the number of bits. Suppose that an approximated line is represented by y=ax+b, the number of samples obtained subsequent to the (n+1)-th bit is represented by S_n+1. The number of bits is obtained to be closer to B_n+1 in the following expression.

$$(yn+S\_n+1)=a(xn+B\_n+1)+b \quad (8)$$

In each of the first embodiment and the second embodiment, a=e/d and b=f/d (d, e, and f are integers). When those are substituted in Expression (8), $$d(yn+S\_n+1)=e(xn+B\_n+1)+f.$$

Suppose that B_n+1 is determined to be only one of 1, 2, and 3 from encoding. In this case, with respect to d(yn+S_n+1), e(xn+1)+f, e(xn+2)+f, and e(xn+3)+f are calculated. The closest one of three calculated results is obtained; this can omit a division circuit. The above configuration can prevent the increase in the size of the circuit, by the division circuit that is omitted.

The reason why in encoding, the maximum continuous bit length is desirably 3 bits is as follows. That is, the mode of encoding generally used in serial data communication is 8b10b encoding. The maximum continuous bit length is 5 bits in 8b10b encoding. For simple calculation in the present disclosure, the maximum continuous bit length is desirable less than 5 bits. 8b10b encoding is performed on the basis of 1 Byte (8 bits) on account of internal processing of LSI. Encoding on the basis of 1 Nibble (4 bits) is usable as encoding performed on the basis of less than 1 Byte; thus, 4b5b encoding is suitable. Since the numerical values that can be expressed by 4 bits is 16 kinds (0 to 15), it is necessary to express 16 kinds of control codes by 5 bits after 4b5b encoding. However, the combinations under the condition that the maximum continuous bit length in 5 bits is 2 bits are as follows: "01010", "10101", "01011", "10100", "01001", "10110", "01101", "10010", "00101", "11010", "01100", "10011", "00100", and "11011". Thus, the number of combinations is only 14 kinds and does not reach 16 kinds that can be expressed by 4 bits. Therefore, it is desirable to adopt 4b5b encoding with the maximum continuous bit length being 3 bits.

The above explains the case where B_n+1 is determined to be only one of 1, 2, 3 bits from encoding. In practical data communications, the maximum continuous bit length is determined in the encoding. For example, 8b/10b encoding used in PCI express or other data communications uses a maximum continuous bit length being 5 bits. While omitting a division circuit, this case only needs to find which one of 1, 2, 3, 4, and 5 bits is the closest value. Even if 6 bits is found to be the closest value, there is a high possibility that 5 bits is recognized incorrectly to be 6 bits. Thus, when 5 bits or more than 5 bits is found, it may be supposed that the closest value is recognized to be 5 bits uniformly. FIG. 16 indicates the result from applying the present embodiment to the encoding providing continuous 3 bits in the data communication speed of 16 [Mbps]. This proves that a jitter tolerance is improved by applying the present embodiment to both the frequency errors of ±20% (the present embodiment provides a value higher than or equivalent to that in the case where the present embodiment is not applied). The above configuration can reduce a circuit that calculates the number of jitters not smaller than the maximum continuous bit length in encoding while improving a jitter tolerance.

Fifth Embodiment

Figure 17:
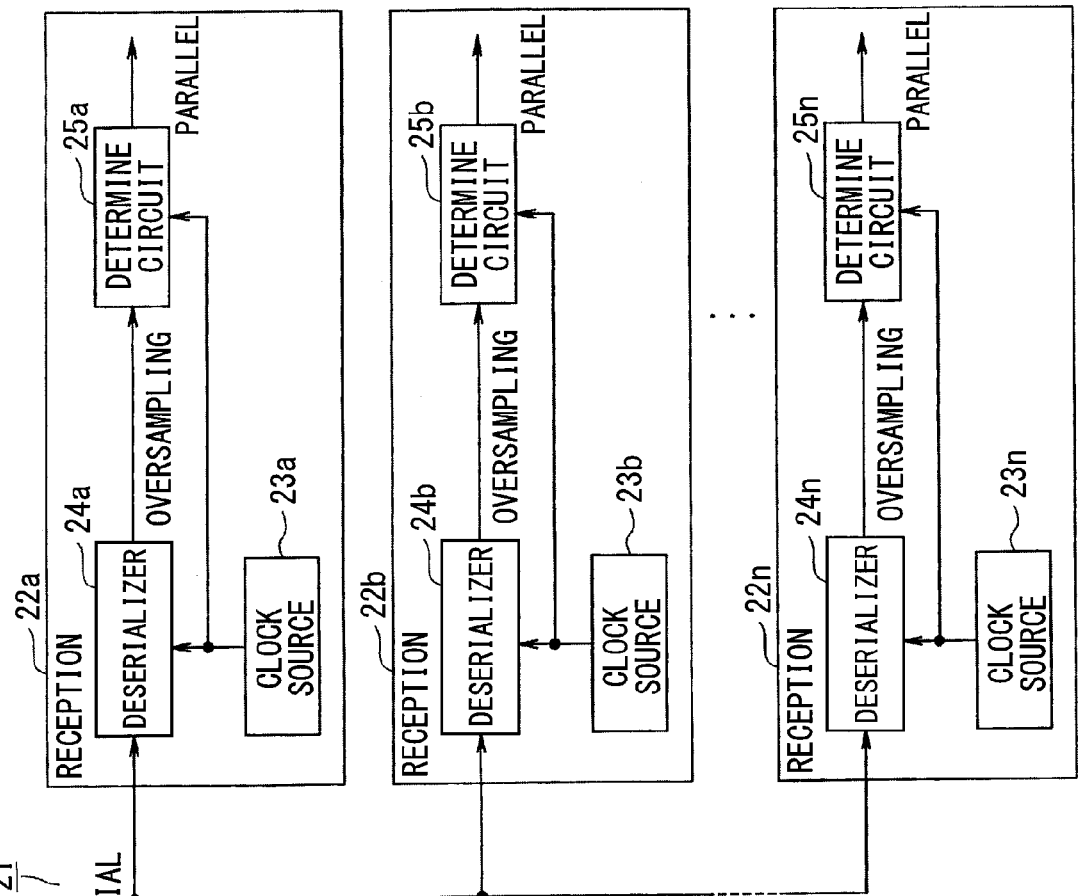
FIG. 17 is a diagram equivalent to FIG. 1, according to a fifth embodiment of the present disclosure.

The following will explain a fifth embodiment according to the present disclosure with reference to FIG. 17.

The first to fourth embodiments connect one data transmission apparatus with one data reception apparatus. The fifth embodiment connects one data transmission apparatus and several data reception apparatuses.

A data communication system 1 includes one data transmission apparatus 2 that transmits data and a plurality of data reception apparatuses 22a to 22n that receive data. The plurality of data reception apparatuses 22a to 22n may be mounted in a single LSI, or in respective different LSIs. The data reception apparatus 22a to 22n each are equivalent to the data reception apparatus 3 explained in the first embodiment and include receive-side clock sources 23a to 23n, deserializers 24a to 24n, and data determination circuits 25a to 25n. The data determination circuits 25a to 25n each include the function to determine data, the function to calculate an integrated number of bits, and the function to calculate an integrated number of samples.

The data transmission apparatus 2 transmits serial data to the plurality of data reception apparatuses 22a to 22n simultaneously or according to a prescribed order; the serial data has a transmission destination that is any one or all among the plurality of data reception apparatuses 22a to 22n. When receiving the serial data from the data transmission apparatus 2, the respective data reception apparatuses 22a to 22n process the received serial data as explained in the first to fourth embodiments.

In this case, the data reception apparatuses 22a to 22n each include respective unique receive-side clock sources 23a to 23n; a clock frequency error from the transmit-side clock source 4 arises independently (individually) in each of the data reception apparatuses 22a to 22n. In this case, each of the data reception apparatuses 20a to 20n obtains an approximated line independently to thereby determine data suitably. Thus, even when the plurality of data reception apparatuses 22a to 22n are provided, each obtains an approximated line independently. This can cancel the influence due to a clock frequency error of each apparatus. Moreover, suppose that an additional data reception apparatus may be added in a data communication system, for example. Even in such a case, without considering a frequency error of a receive clock of a receive-side clock source in another data reception apparatus, a frequency of the receive clock of the receive-side clock source of the additional data reception apparatus can be selected. This can reduce the restriction at the time of extending the data communication system 21.

Sixth Embodiment

Figure 18:
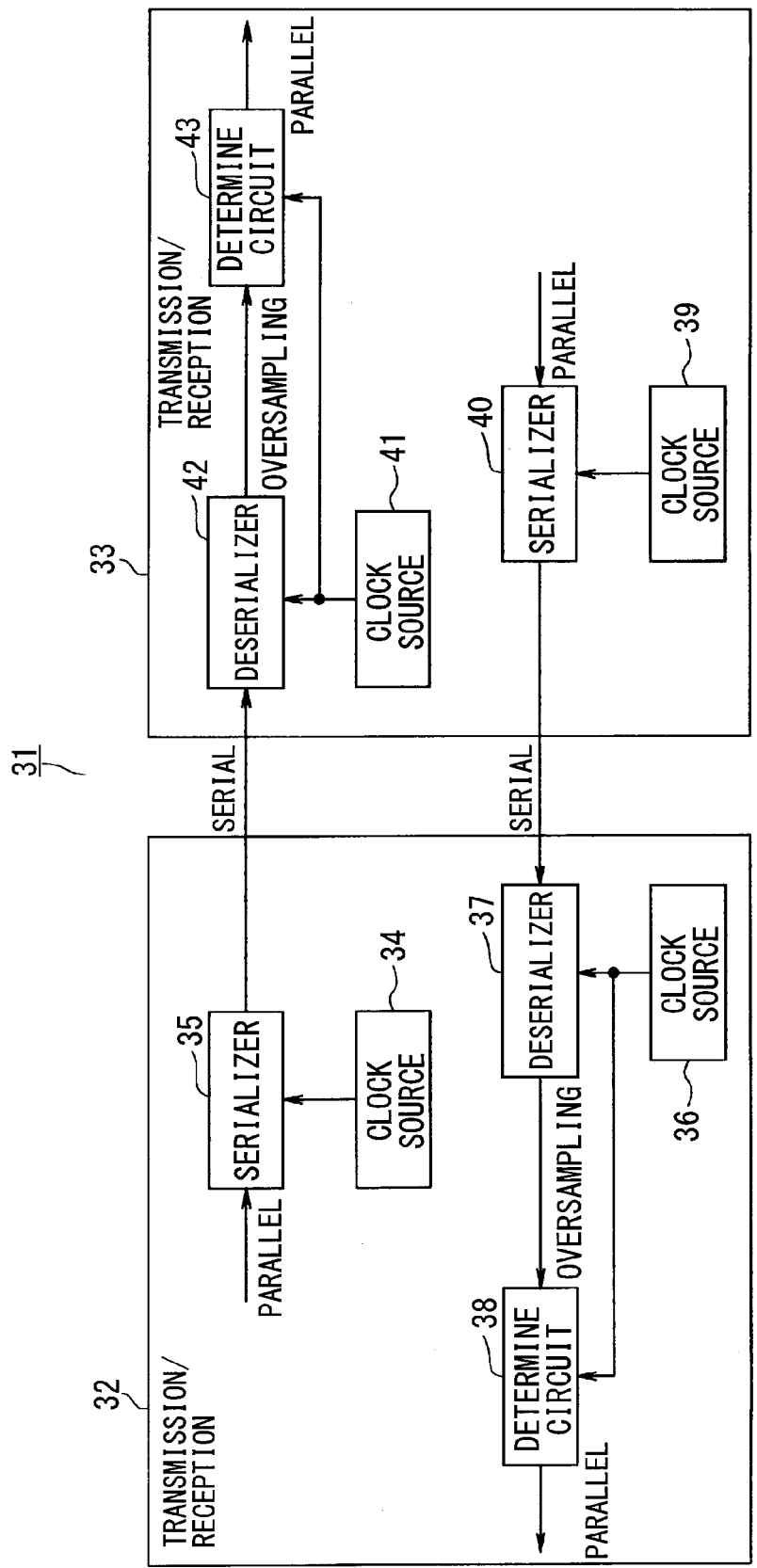
FIG. 18 is a diagram equivalent to FIG. 1, according to a sixth embodiment of the present disclosure.

The following will explain a sixth embodiment according to the present disclosure with reference to FIG. 18.

The first to fifth embodiments each provide the data communication that transmits data in one way from the data transmission apparatus 2 to the data reception apparatus 3. The sixth embodiment provides the data communication that transmits data bi-directionally between data transmission/reception apparatuses that have functions of data transmission and data reception.

The data communication system 31 includes data transmission/reception apparatuses 32, 33, each of which transmits and receives data. The data transmission/reception apparatus 32 includes a transmit-side clock source 34 and a serializer 35 as a data transmission function, while including a receive-side clock source 36, a deserializer 37, and a data determination circuit 38 as a data reception function. The data transmission/reception apparatus 33 includes a transmit-side clock source 39 and a serializer 40 as a data transmission function, while including a receive-side clock source 41, a deserializer 42, and a data determination circuit 43 as a data reception function. The data determination circuits 38, 43 each include the function to determine data, the function to calculate an integrated number of bits, and the function to calculate an integrated number of samples, which are explained in the first embodiment. Further, the data transmission/reception apparatus 32 may include a common clock source serving as both a transmit-side clock source 34 and a receive-side clock source 36. Further, the data transmission/reception apparatus 33 may include a common clock source serving as both a transmit-side clock source 39 and a receive-side clock source 41.

In the above-mentioned configuration, the data communication from the data transmission/reception apparatus 32 to the data transmission/reception apparatus 33 and the data communication from the data transmission/reception apparatus 33 to the data transmission/reception apparatus 32 are performed simultaneously; the data communications are performed in full-duplex communications. In this case, when receiving serial data, the data transmission/reception apparatus 32, 33 process the received serial data as explained in the first to fourth embodiments.

Seventh Embodiment

Figure 19:
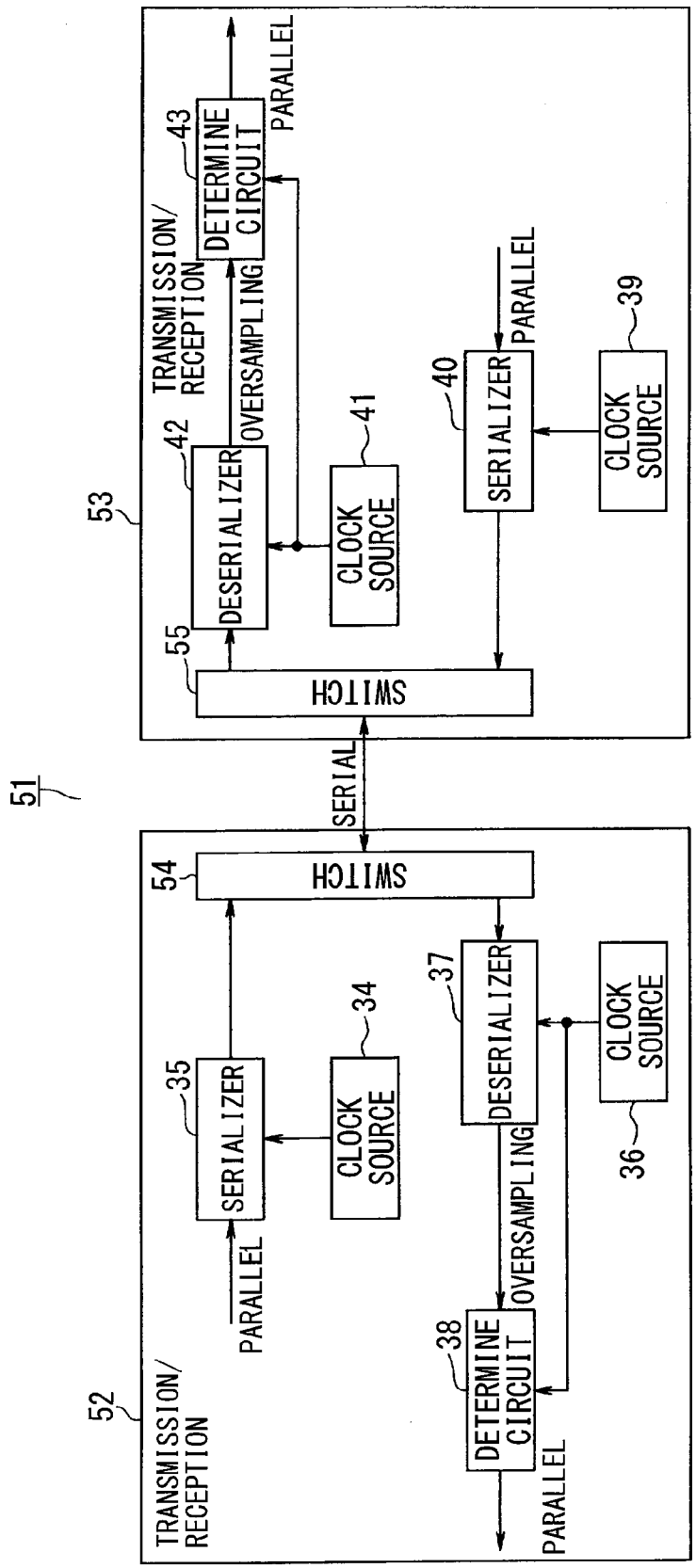
FIG. 19 is a diagram equivalent to FIG. 1, according to a seventh embodiment of the present disclosure.

The following will explain a seventh embodiment according to the present disclosure with reference to FIG. 19. The sixth embodiment provides data transmission/reception apparatuses 32, 33 performing full-duplex communications. The seventh embodiment provides a data transmission/reception apparatus performing half-duplex communications. The data communication system 51 includes data transmission/reception apparatuses 52, 53, each of which transmits and receives data. The data transmission/reception apparatus 52 includes a transmit-side clock source 34 and a serializer 35 as a data transmission function, while including a receive-side clock source 36, a deserializer 37, and a data determination circuit 38 as a data reception function. Moreover, the data transmission/reception apparatus 52 further includes a data switch circuit 54 to switch timing of transmission/reception of data. The data transmission/reception apparatus 53 includes a transmit-side clock source 39 and a serializer 40 as a data transmission function, while including a receive-side clock source 41, a deserializer 42, and a data determination circuit 43 as a data reception function. Moreover, the data transmission/reception apparatus 53 further includes a data switch circuit 55 to switch timing of transmission/reception of data.

Under the above-mentioned configuration, in the data transmission/reception apparatuses 52, 53, the data switch circuit 54 switches the timing of transmission/reception of data in the data transmission/reception apparatus 52; the data switch circuit 55 switches the timing of transmission/reception of data in the data transmission/reception apparatus 53. The data communication from the data transmission/reception apparatus 52 to the data transmission/reception apparatus 53 and the data communication from the data transmission/reception apparatus 53 to the data transmission/reception apparatus 52 are performed with time division and the data communications are performed with half-duplex communications.

Eighth Embodiment

The following will explain an eighth embodiment according to the present disclosure with reference to FIG. 20 and FIGS. 21A, 21B, and 21C.

The second embodiment obtains an approximated line through straight line approximation using both end points among a plurality of points. The second embodiment performs a division as well as a multiplication, as indicated in the expressions. The eighth embodiment uses only a shift circuit to perform an equivalent process.

Figure 20:
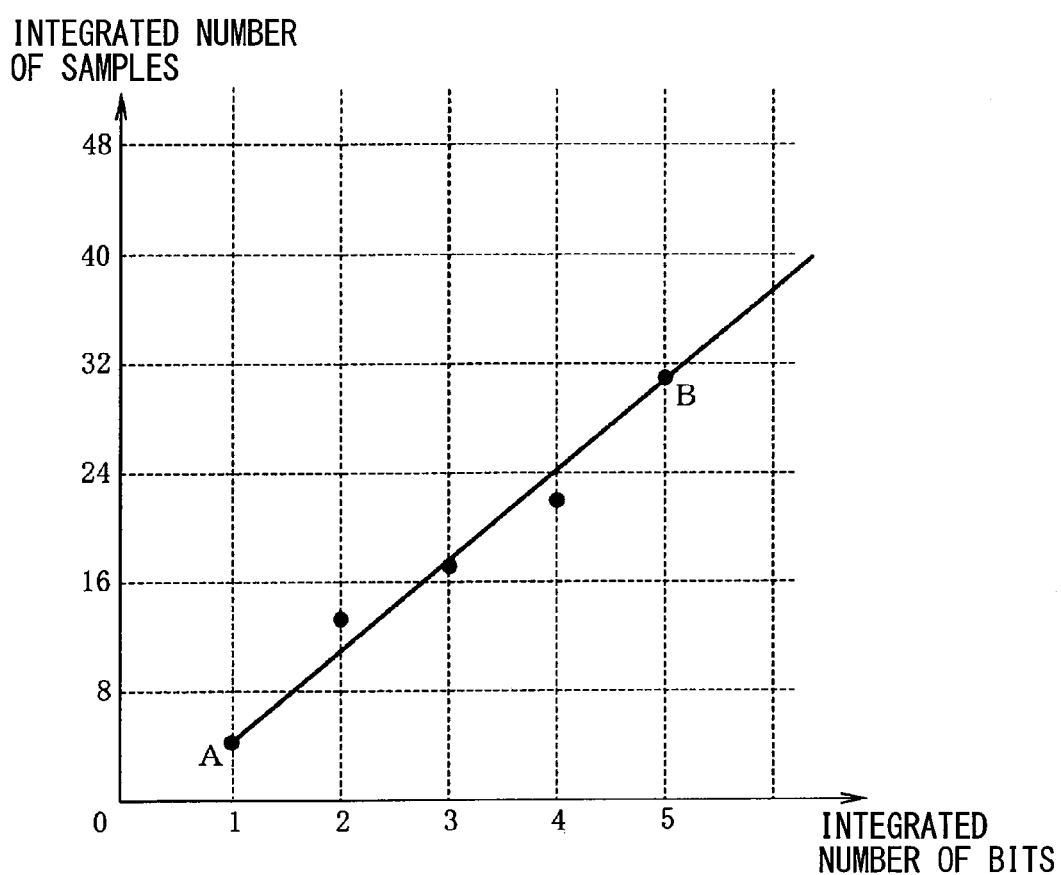
FIG. 20 is a diagram equivalent to FIG. 7, according to an eighth embodiment of the present disclosure.
Figure 21A:
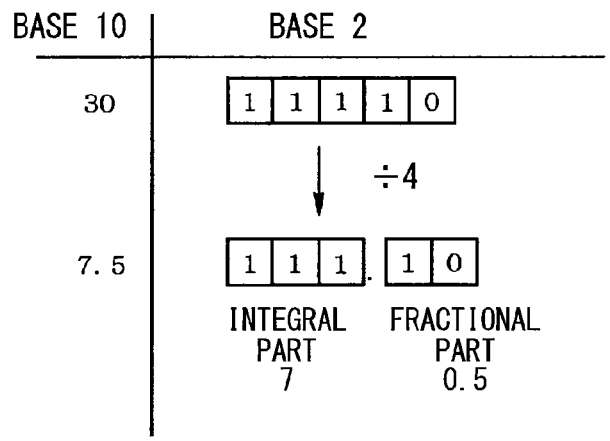
FIGS. 21A, 21B, and 21C are diagrams each illustrating a procedure of obtaining the number of samples.
Figure 21B:
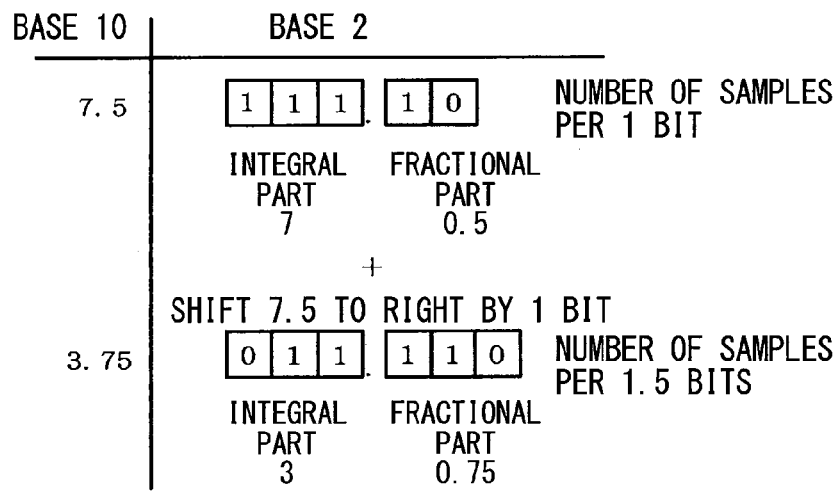
Figure 21C:
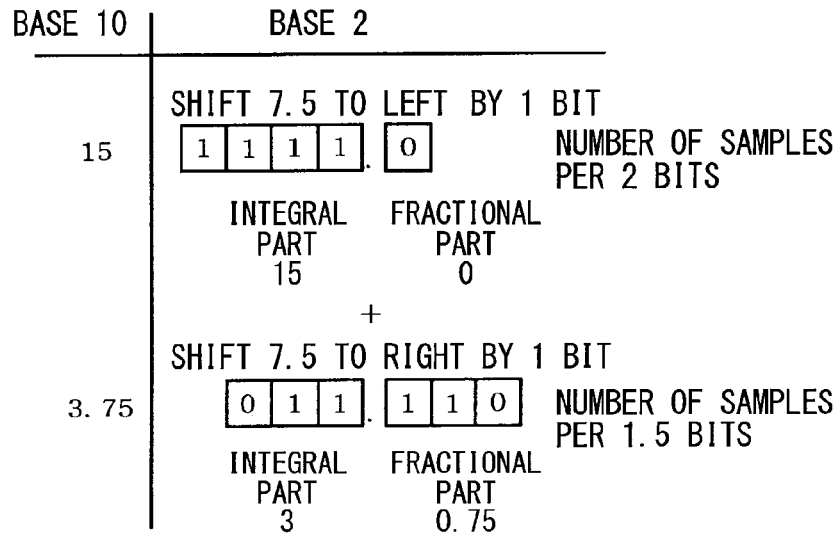

To be specific, the data determination circuit 8 certainly selects a segment containing $2^n$ bits (n is an integer) as a segment for a straight line interpolation when the integrated number of bits and the integrated number of samples have the relation indicated in FIG. 20. For example, the segment containing 4 bits is selected as a segment for straight line interpolation as indicated in FIG. 20. In this case, when the integrated number of samples corresponding to the segment containing 4 bits for straight line interpolation is defined as "Sn", the number of samples corresponding to 1 bit is defined as "Sn/4". When a segment for straight line interpolation contains 4 bits, the calculation that divides the integrated number of samples by the number of bits contained in the segment for straight line interpolation is performed only by shifting a fixed base point in a practical LSI. That is, when the integrated number of samples is "30", 30/4=7.5 is to be obtained as follows, for instance. As indicated in FIG. 21A, such a result similar to that from a division is obtained only by shifting the base point. It is noted that a practical LSI only determines in which point of the bits a base point exists, and the number of bits is unchanged before and after shifting the base point. This does not need a specific shift circuit or a new circuit configuration.

Moreover, if the number of samples per 1 bit is obtained, the number of samples per 1.5 bits or the number of samples per 2.5 bits can be obtained. That is, with reference to FIG. 21B, the number of samples per 0.5 bit is obtained by applying 1 bit right shift to the number of samples per 1 bit; adding the number of samples per 1 bit and the number of samples per 0.5 bit results in obtaining the number of samples per 1.5 bits. Further, with reference to FIG. 21C, the number of samples per 2 bits is obtained by applying 1 bit left shift to the number of samples per 1 bit; adding the number of samples per 2 bits and the number of samples per 0.5 bit results in obtaining the number of samples per 2.5 bits.

Further, not only the number of samples per n bits, n being an integral, but also the number of samples per n bits, n being a number with a fractional part are obtained; this permits determination of a bit length from the obtained number of samples. For example, when the number of samples obtained is greater than the number of samples per 0.5 bit and smaller than the number of samples per 1.5 bits, the obtained number of samples is determined to have a bit length of "1". Further, for example, when the number of samples obtained is greater than the number of samples per 1.5 bits and smaller than the number of samples per 2.5 bits, the obtained number of samples is determined to have a bit length of "2".

Ninth Embodiment

Figure 22:
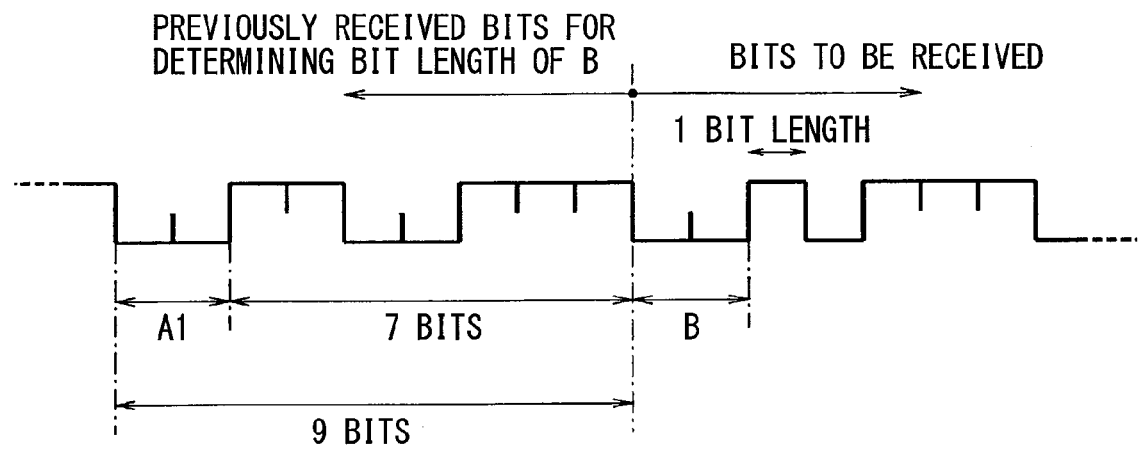
FIG. 22 is a diagram illustrating a ninth embodiment of the present disclosure and illustrating a pattern of a bit string.

The following will explain a ninth embodiment according to the present disclosure with reference to FIG. 22. The eighth embodiment premises that the segment for straight line interpolation is selected as a segment containing $2^n$ bits (n is an integer). The preamble provides a bit string that exhibits repeatedly a regular pattern and allows an arbitrary selection of the number of bits; thus, a segment containing $2^n$ bits may be easily selected. However, the data provides a bit string that is random; this may not allow a segment containing $2^n$ bits to be selected. That is, suppose the case where a segment containing 8 bits ($2^3$) is going to be selected as a segment for straight line interpolation. As indicated in FIG. 22, when the 8th bit does not have a change point and the change point exists in the 7th bit or the 9th bit instead, the number of samples equivalent to the segment containing 8 bits cannot be obtained.

In this case, the bit string of the data is divided into a first segment where the number of bits is $2^n$ and all the bits each have an identical value, and a second segment where the number of bits is not $2^n$ and the starting bit has a value different from the values of the bits in the first segment. In FIG. 22, if the number of bits of the segment (first segment) indicated with A1 is $2^m$ (m is an integer), the number of samples in the segment indicated with A1 is subjected to a bit shift, as explained in the above-mentioned eighth embodiment to obtain the number of samples per 1 bit in the segment indicated with A1. Then, adding the number of samples per 1 bit indicated with A1 and the number of samples in the segment containing 7 bits (second segment) results in obtaining the number of samples per 8 bits. Then, like the calculation explained in the above-mentioned eighth embodiment, the number of samples averaged in 8 bits can be obtained without using a multiplication circuit or a division circuit and the bit length of the segment indicated with B can be then obtained. Although the above explains the case of obtaining the number of samples averaged in 8 bits, If $2^n$ bits (n is an integer) is used, the number of samples averaged in $2^n$ bits can be obtained similarly. Moreover, although the above explains the case where the 7-bit segment (second segment) follows the segment (first segment) indicated with A1, the case where the segment (first segment) indicated with A1 follows the 7-bit segment (second segment) may be applied similarly. That is, the anteroposterior relation of the first segment and the second segment may be changed.

Tenth Embodiment

Figure 23:
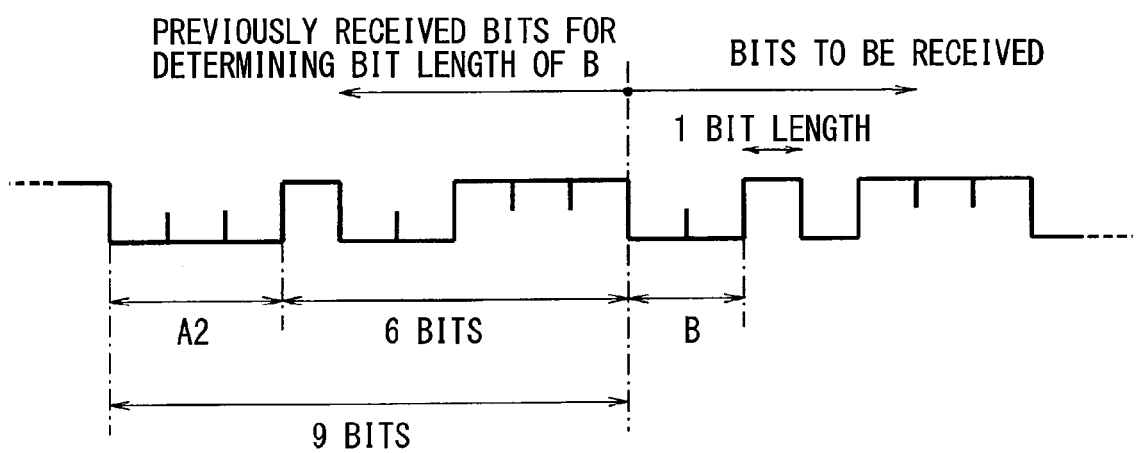
FIG. 23 is a diagram equivalent to FIG. 22, according to a tenth embodiment of the present disclosure.

The following will explain a tenth embodiment according to the present disclosure with reference to FIG. 23 and FIG. 24. Although the ninth embodiment explains the case where the segment indicated with A1 contains $2^m$ bits (m is an integer), as indicated in FIG. 23, there is a case where the segment indicated with A2 is not $2^m$ (m is an integer). In this case, the bit string of data is divided into a third segment where all the values of bits are identical and a fourth segment where the value of the starting bit has a value different from the values of the bits of the third segment. In FIG. 23, the number of samples on an integer basis can be obtained in the segment (third segment) indicated with A2. To obtain the number of samples per 1 bit, a division circuit is necessary to divide the number of samples by a different value ("3" in FIG. 23) that is different from $2^m$ (m is an integer).

In such a case, a simplest method is to prepare a table. For example, in the data communication where encoding is performed with the maximum continuous bit length being 3 bits, the segment indicated with A2 contains any one of 1 bit, 2 bits, and 3 bits. If the segment indicated with A2 contains 1 bit, the number of samples corresponding to 8 bits can be desirably obtained certainly. If the segment indicated with A2 contains 2 bits, the number of samples corresponding to 8 bits can be obtained by using the method in the ninth embodiment. That is, the case where the segment indicated with A2 is 3 bits needs to be considered.

As a precondition, when the number of samples per 1 bit is set to "10", the number of samples corresponding to 3 bits is "30". When it is assumed that each of the data transmission side and the data reception side has a reference frequency error of 10%, the data transmission side and the data reception side have a reference frequency error of 20% collectively. Here, suppose that the number of samples is "30" and the error is 20%. In this case, the table only needs to prepare 13 kinds of "24 to 36". A margin of each end is assumed to be 2 kinds. Eventually, the table only needs to prepare 17 kinds of "22 to 38" as indicated in FIG. 24. This needs very small increase in the size of the circuit. In the present embodiment, to obtain the number of samples per 1 bit, the number of samples corresponding to 3 bits needs to be divided by "3"; a part to be unable to be divided evenly becomes an error. However, this error is as small as 2%, which gives little effect on the determination accuracy. Moreover, the fractional part is repeated each three columns; the table can be practically replaced with a bit operation to thereby suppress the increase in the size of the circuit. Then, the number of samples corresponding to 2 bits indicated with A2 and the number of samples in the segment containing 6 bits (fourth segment) are added to obtain the number of samples per 8 bits. Then, like the calculation explained in the above-mentioned eighth embodiment, the number of samples averaged in 8 bits can be obtained without using a multiplication circuit or a division circuit and the bit length of the segment indicated in B can be obtained. Moreover, although the above explains the case where the 6-bit segment (fourth segment) follows the segment (third segment) indicated with A2, the case where the segment (third segment) indicated with A2 follows the 6-bit segment (fourth segment) may be applied similarly. That is, the anteroposterior relation of the third segment and the fourth segment may be changed.

Eleventh Embodiment

Figure 25:
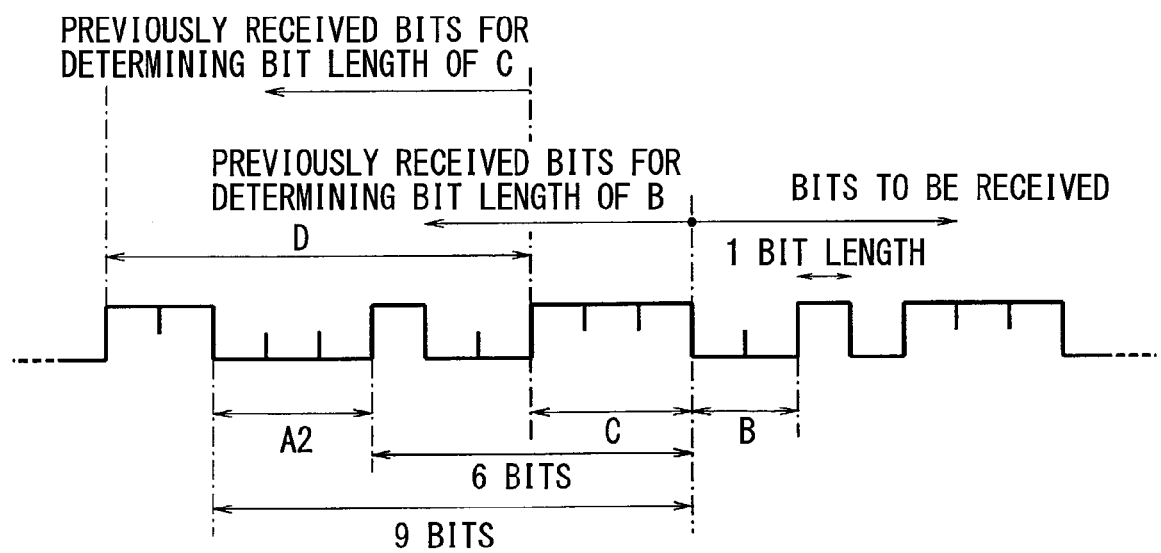
FIG. 25 is a diagram equivalent to FIG. 22, according to an eleventh embodiment of the present disclosure.

The following will explain an eleventh embodiment according to the present disclosure with reference to FIG. 25. The tenth embodiment explains the method where when the segment indicated with A2 does not contain $2^m$ bits (m is an integer), the table is used to obtain the number of samples per 1 bit. The method to use a table is effective in the data communication which encodes with the maximum continuous bit length of about 3 bits. However, in the data communication that encodes with the maximum continuous bit length set to be longer than 3 bits, the table needs to have a large size. This is not realistic.

In order to determine a bit length of the segment indicated with B in FIG. 25, the number of samples per 1 bit of the segment indicated with A2 is needed (whether to be an integer or a number with a fractional part is not required). Incidentally, before a bit length of the segment indicated with B is determined, the number of samples of the segment (fifth segment) indicated with D is previously used in order to determine a bit length of the segment indicated with C. The segment indicated with A2 is included in the segment indicated with D. When the number of samples per 1 bit of the segment indicated with D is previously obtained, the number of samples per 1 bit of the segment indicated with A2 may be obtained based on the number of samples per 1 bit of the segment indicated with D. Then, the number of samples per 2 bits in the segment indicated with A2 and the number of samples in the segment containing 6 bits are added, to obtain the number of samples per 8 bits. Then, like the calculation explained in the above-mentioned eighth embodiment, the number of samples averaged in 8 bits can be obtained without using a multiplication circuit or a division circuit and the bit length of the segment indicated with B can be obtained.

The above explains the case where the segment indicated with D contains $2^n$ bits. A practical data communication does not always provide a segment indicated with D to contain $2^n$ bits. Even in this case, the above-mentioned methods may be performed recursively using the results obtained when the bit length is previously determined. The data communication certainly contains a preamble at the start of the frame. The preamble can provide the number of samples per 1 bit on a basis of a number with a fractional part certainly. Even when the change point of bit is not $2^n$-th bit, a similar method may be used repeatedly.

Other Embodiments

The present disclosure is not limited only to the above-mentioned embodiments, and can be modified or extended as follows.

Without being applied to the data communication between LSIs, the present disclosure may be applied to the data communications for uses unrelated to an ECU mounted in a vehicle.

The fifth embodiment may be combined with the sixth embodiment or the seventh embodiment. That is, in the configuration including a plurality of data reception apparatuses $22a$ to $22n$, one data transmission apparatus 2 may perform data transmission with a plurality of data reception apparatuses $22a$ to $22n$ with the full-duplex communication or the half-duplex communication.

Although the present disclosure is described based on the embodiment, it is understood that the present disclosure does not need to be limited to the embodiment or its configuration. The present disclosure also includes various modification examples and modifications within a scope of an equivalent. In addition, various combinations or embodiments, and other combinations or embodiments which contain only a single element, more than one element, or less than it may be included within a scope or concept of the present disclosure.

The invention claimed is:

1. A data reception apparatus comprising:
 a receive-side clock source separate from a transmit-side clock source of a data transmission apparatus that transmits data, the receive-side clock source generating a receive clock and outputting the receive clock;
 an oversampling data generation section that generates oversampling data by oversampling each bit of a received bit string that is received from the data transmission apparatus in synchronization with the receive clock inputted from the receive-side clock source;
 a bit integrated number calculation section that calculates an integrated number of bits by integrating a predetermined number of bits in the received bit string;
 a sample integrated number calculation section that calculates an integrated number of samples by integrating the number of samples corresponding to each bit of the predetermined number of bits integrated by the bit integrated number calculation section, in the oversampling data generated by the oversampling data generation section; and
 a data determination section
  that obtains an approximated line based on a plurality of points each of which indicates correspondence between the integrated number of bits and the integrated number of samples, and
  that determines, based on the approximated line, a bit length in a bit string in the oversampling data generated by the oversampling data, the bit string corresponding to a segment in which identical values continue in the oversampling data after the integrated number of samples calculated by the sample integrated number calculation section.

2. The data reception apparatus according to claim 1, wherein
 the data determination section obtains the approximated line with a least squares technique that has, as a parameter, each of the plurality of points.

3. The data reception apparatus according to claim 1, wherein
 the data determination section obtains the approximated line with a straight line interpolation that has, as a parameter, each of both end points within the plurality of points.

4. The data reception apparatus according to claim 3, wherein
 the data determination section
  selects a subject segment having a predetermined number of bits, where the approximated line is obtained with the straight line interpolation, as a $2^n$ -bit segment that has $2^n$ bits where n is an integer, and
  moves a base point on base 2 expression of the integrated number of samples in the selected subject segment to determine the bit length in the bit string in the oversampling data generated by the oversampling data generation section, the bit string corresponding to the segment in which identical values continue in the oversampling data after the integrated number of samples calculated by the sample integrated number calculation section.

5. The data reception apparatus according to claim 4, wherein
 the data determination section
  moves the base point on base 2 expression of the number of samples corresponding to a bit length that is on a basis of an integer containing only an integral part to obtain the number of samples corresponding to a bit length that is on a basis of a number containing an integral part and a fractional part, and
  compares the number of samples corresponding to the bit length on the basis of an integer with the number of samples corresponding to the bit length on the basis of a number containing an integral part and a fractional part, to determine the bit length in the bit string in the oversampling data generated by the oversampling data generation section, the bit string corresponding to the segment in which identical values continue in the oversampling data after the integrated numbers of samples calculated by the sample integrated number calculation section.

6. The data reception apparatus according to claim 4, wherein
 when it is impossible to select the subject segment, where the approximate line is obtained with the straight line interpolation, as the $2^n$ -bit segment that has $2^n$ bits,
 the data determination section
  divides the subject segment into a first segment having $2^m$ bits where m is an integer and a second segment not having $2^m$ bits,
  obtains the number of samples per one bit in the first segment, and
  adds a predetermined multiple of the number of samples per one bit in the first segment to the number of samples in the second segment, to obtain a combined segment having $2^n$ bits and calculate the integrated number of samples in the combined segment having $2^n$ bits.

7. The data reception apparatus according to claim 6, wherein
 the data determination section divides into the first segment and the second segment such that all values of bits of the first segment are identical and a value of a starting bit of the second segment is different from the values of the first segment.

8. The data reception apparatus according to claim 4, wherein
 when it is impossible to select the subject segment, where the approximate line is obtained with the straight line interpolation, as the $2^n$ -bit segment that has $2^n$ bits, and simultaneously when it is impossible to divide the subject segment into a first segment having $2^m$ bits where m is an integer and a second segment not having $2^m$ bits,
 the data determination section
  divides the subject segment into a third segment that does not have $2^o$ bits where o is an integer and a fourth segment that does not have $2^p$ bits where p is an integer, obtains the number of samples per one bit in the third segment with a table previously prepared, and adds a predetermined multiple of the number of samples per one bit in the third segment to the number of samples in the fourth segment, to obtain a combined segment having $2^n$ bits and calculate the integrated number of samples in the combined segment having $2^n$ bits.

9. The data reception apparatus according to claim 4, wherein:

when it is impossible to select the subject segment, where the approximate line is obtained with the straight line interpolation, as the $2^n$-bit segment that has $2^n$ bits, and simultaneously when it is impossible to divide the subject segment into a first segment having $2^m$ bits where m is an integer and a second segment not having $2^m$ bits, the data determination section divides the subject segment into a third segment that does not have $2^o$ bits where o is an integer and a fourth segment that does not have $2^p$ bits where p is an integer; and when the third segment is included in a fifth segment for which the number of samples per one bit is obtained previously, the data determination section obtains the number of samples per one bit in the third segment from the number of samples per one bit that is previously obtained in the fifth segment, and adds a predetermined multiple of the number of samples per one bit in the third segment to the number of samples in the fourth segment, to obtain a combined segment having $2^n$ bits and calculate the integrated number of samples in the combined segment having $2^n$ bits.

10. The data reception apparatus according to claim 9, wherein the data determination section obtains the number of samples per one bit in the third segment recursively.

11. The data reception apparatus according to claim 8, wherein the data determination section divides into the third segment and the fourth segment such that all values of bits in the third segment are identical, and a value of a starting bit in the fourth segment is different from the values of bits in the third segment.

12. The data reception apparatus according to claim 1, wherein the data determination section obtains the approximated line such that the plurality of points are points corresponding to a predetermined number of bits of a bit string included in a preamble.

13. The data reception apparatus according to claim 1, wherein the data determination section obtains the approximated line such that the plurality of points are points corresponding to a predetermined number of bits that is a remaining after excluding a set number of bits, which starts from a starting bit, from a bit string included in a preamble.

14. The data reception apparatus according to claim 1, wherein the data determination section obtains the approximated line such that a segment between the plurality of points is variable.

15. The data reception apparatus according to claim 14, wherein the data determination section obtains the approximated line such that a segment between the plurality of points is variable with respect to a bit number of the bit string that is less than a threshold value, and a segment between the plurality of points is constant with respect to a bit number of the bit string that is not less than the threshold value.

16. The data reception apparatus according to claim 1, wherein the data determination section obtains the approximated line using a multiplication circuit.

17. The data reception apparatus according to claim 1, wherein when determining that a bit length of a bit string, the bit length being determined based on the approximated line, exceeds a maximum continuous bit length in encoding of a communication protocol, the data determination section determines that the determined bit length is a maximum continuous bit length.

18. The data reception apparatus according to claim 1, wherein the oversampling data generation section oversamples the bit string with the number of samples per one bit, the number of samples per one bit ranging from six samples to ten samples.

19. A data communication system comprising:

a plurality of the data reception apparatuses according to claim 1, the plurality of the data reception apparatuses each receiving a bit string from an identical data transmission apparatus.

* * * * *